(12) United States Patent
Ohtsuki

(10) Patent No.: US 6,947,123 B1
(45) Date of Patent: Sep. 20, 2005

(54) EXPOSURE DEVICE WITH LASER DEVICE

(75) Inventor: Tomoko Ohtsuki, Allentown, PA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/070,682

(22) PCT Filed: Sep. 8, 2000

(86) PCT No.: PCT/JP00/06130
§ 371 (c)(1),
(2), (4) Date: Sep. 4, 2002

(87) PCT Pub. No.: WO01/20651
PCT Pub. Date: Mar. 22, 2001

(30) Foreign Application Priority Data

Sep. 10, 1999 (JP) .............................. 11/25831

(51) Int. Cl.$^7$ ................. G03B 27/54; G03B 27/72; G02F 1/35
(52) U.S. Cl. .................. 355/67; 355/71; 359/326
(58) Field of Search .................. 359/326, 328, 359/332, 341.1; 372/5, 22; 355/67, 71, 77

(56) References Cited

U.S. PATENT DOCUMENTS

| 5,050,949 | A | * | 9/1991 | DiGiovanni et al. ..... 359/337.4 |
| 5,170,273 | A | * | 12/1992 | Nishio .......................... 398/48 |
| 5,745,284 | A | | 4/1998 | Goldberg et al. |
| 5,838,709 | A | | 11/1998 | Owa |
| 6,055,092 | A | * | 4/2000 | Sugaya et al. .............. 359/337 |
| 6,128,030 | A | * | 10/2000 | Kikuchi et al. ............. 347/255 |
| 6,590,698 | B1 | * | 7/2003 | Ohtsuki et al. ............. 359/326 |

FOREIGN PATENT DOCUMENTS

| EP | 1 063 742 A1 | 12/2000 |
| JP | A 8-97125 | 4/1996 |
| JP | A 8-334803 | 12/1996 |
| JP | A 9-114100 | 5/1997 |
| JP | A 9-148658 | 6/1997 |
| JP | A 10-135555 | 5/1998 |

* cited by examiner

Primary Examiner—Rodney Fuller
(74) Attorney, Agent, or Firm—Oliff & Berridge PLC

(57) ABSTRACT

An exposure apparatus has a light source comprising a laser device that is small and easy to maintain. The laser device comprises a laser oscillator for generating a single-wavelength laser beam (LB3) within a wavelength range including infrared and visible regions; an optical amplifier (18) for amplifying a laser beam (LB3); and a wavelength converter for converting the amplified laser beam into ultraviolet light using a nonlinear optical crystal. The optical amplifier (18) includes a plurality of stages of optical fiber amplifiers (22, 25) for sequential amplification of the laser beam (LB3), and a narrow-band filter (24A) and an isolator (IS3) arranged between optical fiber amplifiers.

47 Claims, 7 Drawing Sheets

EXPOSURE DEVICE WITH LASER DEVICE

This application is the national phase under 35 U.S.C. 371 of prior PCT International Application No. PCT/JP00/06130 which has an International filing date of Sep. 8, 2000 which designated the United States of America, the entire contents of which are hereby incorporated by reference.

TECHNICAL FIELD

The present invention relates to an exposure apparatus including a laser device which generates ultraviolet light. More specifically, the present invention is preferably used as an exposure apparatus used in a photolithography process for manufacturing microdevices, such as semiconductor devices, image pickup devices (such as CCDs), liquid crystal display devices, plasma display devices, and thin-film magnetic heads.

BACKGROUND ART

For example, an exposure apparatus used in a photolithography process for manufacturing a semiconductor integrated circuit optically reduces and projectively exposes a circuit pattern accurately rendered on a reticle (photomask) used as a mask, onto the photoresist-coated surface of a wafer as a substrate. In the exposure, shortening of an exposure-light wavelength (exposure wavelength) is one of the most simple and effective methods to reduce the minimum pattern size (resolution) on the wafer. Hereinbelow, a description will be made regarding conditions that should be provided to configure an exposure light source, in addition to those for the implementation of the wavelength shortening of the exposure-light.

First, for example, an optical output of several watts is required. The optical output is required to reduce time necessary for exposure and transfer of an integrate circuit pattern and thereby to increase a throughput.

Second, when the exposure light is ultraviolet light having a wavelength of 300 nm or shorter, an optical material which can be used for a reflector member (lens) of a projection optical system is limited, and hence the difficulty increases for compensation of the chromatic aberration. For this reason, monochromaticity of the exposure light is required, and the spectral linewidth needs to be controlled to be about 1 pm or less.

Third, the timelike coherence increases in association with the reduction in the spectral linewidth. As such, when light having a narrow spectral linewidth (wavelength width) is emitted as it is, an unnecessary interference pattern called "speckle" is generated. Therefore, in the exposure light source, the spatial coherence needs to be reduced to suppress generation of the speckles.

One of conventional short-wavelength light sources satisfying these conditions is a light source using an excimer laser in which the laser oscillation wavelength itself is a short wavelength. Another conventional short-wavelength light source is of a type using harmonic waves generation of an infrared or visible-range laser.

A KrF excimer laser (having a wavelength of 248 nm) is used as the above-described former short-wavelength light source. Currently, an exposure light source using a shorter-wavelength ArF excimer laser (having a wavelength of 193 nm) is under development. In addition, a proposal has been made for use of an $F_2$ laser (having a wavelength of 157 nm), which is one of excimer lasers. However, these excimer lasers are of a large scale, and the oscillatory frequency thereof is at about a level of several kHz in a present stage. This requires a per-pulse energy to be increased to increase a per-unit-time radiation energy. This arises various problems. For example, the transmittance of an optical component tends to vary because of so-called compaction and the like, complicated maintenance is required and hence costs are increased.

As the aforementioned latter method, there is a method that uses a secondary nonlinear optical effect of a nonlinear optical crystal, and thereby converts long wavelength light (infrared light or visible light) into ultraviolet light of short wavelength. For example, a publication ("Longitudinally diode pumped continuous wave 3.5W green laser", L. Y. Liu, M. Oka, W. Wiechmann and S. Kubota; Optics Letters, vol. 19, p189(1994)) discloses a laser source that performs a wavelength conversion of light emitted from a solid-state laser excited by a semiconductor laser beam. The publication regarding the aforementioned conventional example describes a method of performing a wavelength conversion for a 1,064 nm laser beam generated by an Nd:YAG laser by using a nonlinear optical crystal, and thereby generates light of a 4th-harmonic-wave of 266-nm. The solid-state laser is a generic name of lasers using a solid-state laser medium.

In addition, for example, Japanese Patent Application Laid-Open No. 8-334803 and corresponding U.S. Pat. No. 5,838,709 proposed an array laser. The array laser is formed to include a plurality of laser elements in a matrix form (for example, a 10×10 matrix). Each of the laser elements is formed to include a laser-beam generating section including a semiconductor laser, and a wavelength conversion section for performing wavelength conversion for light emitted from the laser-beam generating section into ultraviolet light by using a nonlinear optical crystal.

The conventional array laser thus constituted enables an overall-device light output to be a high output while mitigating light outputs of the individual laser elements to be lower. This enables burden onto the individual nonlinear optical crystals to be lessened. On the other hand, however, since the Individual laser elements are independent of one another, to apply the lasers to an exposure apparatus, oscillatory spectra of the overall laser elements need to be set identical with one another at the overall width up to a level of 1 pm.

For the above reason, for example, the length of a resonator of each of the laser elements needs to be adjusted, or a wavelength-selecting device needs to be inserted into the resonator to cause the laser element to autonomously oscillate with the same wavelength in a single longitudinal mode. In this connection, these methods arises other problems. For example, the aforementioned adjustment requires a sensitive arrangement; and in proportion to the increase in the constituent laser elements, the complexity of the configuration needs to be increased to cause the overall devices to oscillate with the same wavelength.

On the other hand, known methods of actively unifying the wavelengths of the plurality of lasers include an injection seed method (for example, see, "Walter Koechner; Solid-state Laser Engineering, 3rd Edition, Springer Series in Optical Science, Vol.1, Springer-Verlag, ISBN 0-387-53756-2, pp.246–249"). According to this method, light from a single laser light source having a narrow spectral linewidth is split into a plurality of laser elements, and the laser beams are used as induction waves to tune the individual laser elements, and in addition, to causes the spectral linewidths to be narrow bandwidths. However, the method has problems in that it requires an optical system for separating the seed light into the individual laser elements and an oscillatory-wavelength tuning control section, thereby increase complexity of the configuration.

In addition, the array laser as described above enables the overall device to be significantly smaller than that with the conventional excimer laser, it still causes difficulty in packaging so as to reduce the diameter of overall arrayed output beams to several centimeters or smaller. The array laser thus configured has additional problems. For example, each of the arrays requires the wavelength modulator section, thereby increasing the cost. In addition, suppose misalignment has occurred in a part of the laser elements constituting the array, or damage has occurred with the constituent optical elements. In this case, the overall array needs to be once disassembled, the defective part of the laser elements needs to be taken out for repair, and the array needs to be reassembled after repair.

The light source may possibly be configured using optical fibers. However, when light having a high intensity is propagated by simply using the optical fibers, problems can occur in that the wavelength width of the propagated light expands because of the influence of various factors attributed to nonlinear effects of the optical fibers. The factors include self phase modulation (hereinafter will be referred to as "SPM"), stimulated raman scattering (hereinafter will be referred to as "SRS") and stimulated brillouin scattering (hereinafter will be referred to as "SBS"). The wavelength width thus expanded reduces the margin for controlling the spectral linewidth of the exposure light to be 1 pm or less.

In view of the above, a primary object of the present invention is to provide an exposure apparatus including a laser device that can be used for a light source of the exposure apparatus, that enables the exposure apparatus to be miniaturized, and that enables the maintainability to be enhanced.

A second object of the present invention is to provide an exposure apparatus including a laser device capable of suppressing the expansion of the wavelength width attributed to an nonlinear effect of a used optical element.

A third object of the present invention is to provide an exposure apparatus including a laser device which enables the oscillatory frequency to be increased, and enables the spatial coherence to be reduced, as well as enabling the overall oscillatory spectral linewidth to be narrowed with a simple configuration.

Additional object of the present invention is to provide an exposing method using the aforementioned exposure apparatus, a device-manufacturing method and an efficient manufacturing method of the aforementioned exposure apparatus.

DISCLOSURE OF THE INVENTION

A first exposure apparatus of the present invention illuminates a pattern of a first object with ultraviolet light from a laser device and exposes a second object with the ultraviolet light which has passed through the first object, wherein the laser device includes a laser light generation section which generates single wavelength laser light in a wavelength range of from an infrared region to a visible region; an optical amplification section including plural stages of optical fiber amplifiers which serially amplifies the laser light generated by A the laser light generation section, and a narrow band filter and an isolator between the plural stages of the optical fiber amplifiers; and a wavelength conversion section which performs wavelength conversion of the laser light amplified by the optical amplification section into ultraviolet light by using a nonlinear optical crystal.

In this case, to perform timelike removal of ASE (amplified spontaneous emission), a device such as an acousto-optic modulator (AOM) or an electro-optic modulator (EOM) which functions as a gate that is to be turned on only when pulsed light passes through, may be inserted between the plural stages of the optical fiber amplifiers.

A second exposure apparatus of the present invention illuminates a pattern of a first object with ultraviolet light output from a laser device and exposes a second object with the ultraviolet light which has passed through the first object, wherein the laser device includes a laser light generation section which generates single wavelength laser light in a wavelength range of from an infrared region to a visible region; an optical amplification section including plural stages of amplifying optical fibers which amplify the laser light generated by the laser light generation section, an excitation-light generating light source which generates a plurality of amplifying excitation light beams, a narrow band filter or an isolator disposed between the plurality of the amplifying optical fibers, and a bypass member which passes the excitation light in parallel to the narrow band filter or the isolator; and a wavelength conversion section which performs wavelength conversion of the laser light amplified by the optical amplification section into ultraviolet light by using a nonlinear optical crystal.

A third exposure apparatus of the present invention illuminates a pattern of a first object with ultraviolet light from a laser device and exposes a second object with the ultraviolet light which has passed through the pattern of the first object, wherein the laser device includes a laser light generation section which generates single wavelength laser light in a wavelength range of from an infrared region to a visible region; an optical amplification section including plural stages of optical fiber amplifiers which amplify the laser light generated by the laser light generation section, a plurality of excitation-light generating light sources which individually generate excitation light for each of the plural stages of the amplifying optical fibers, and a narrow band filter, a reflection film which reflects the excitation light being formed at one of each of the optical fibers coupled to both sides of the narrow band filter; and a wavelength conversion section which performs wavelength conversion of the laser light amplified by the optical amplification section into ultraviolet lit by using a nonlinear optical crystal.

A fourth exposure apparatus of the present invention illuminates a pattern of a first object with ultraviolet light from a laser device and exposes a second object with the ultraviolet light which has passed through the first object, wherein the laser device includes a laser light generation section which generates single wavelength laser light in a wavelength range of from an infrared region to a visible region; an optical modulation section which modulates the laser light generated by the laser light generation section with a predetermined repetition frequency into pulsed light having a predetermined width; an optical amplification section including an optical fiber amplifier which amplifies the laser light which has passed through the optical modulation section; and a wavelength conversion section which performs wavelength conversion of the laser light amplified by the optical amplification section into ultraviolet light by using a nonlinear optical crystal, the width of the pulsed light modulated by the optical modulation section is set wider than a pulsewidth set for obtaining a predetermined wavelength width with finally generated ultraviolet light.

A fifth exposure apparatus of the present invention illuminates a pattern of a first object with ultraviolet light from a laser device and exposes a second object with the ultraviolet light which has passed through the first object, wherein the laser device includes a laser light generation section which generates single wavelength laser light in a wavelength range of from an infrared region to a visible region; an optical amplification section including an optical fiber amplifier which amplifies the laser light generated by the laser light generation section, a transmitting optical fiber which propagates the laser light amplified by the optical fiber amplifier, and a narrow band filter disposed between the optical fiber amplifier and the transmitting optical fiber; and a wavelength conversion section which performs wavelength conversion of the laser light amplified by the optical amplification section into ultraviolet light by using a nonlinear optical crystal.

A sixth exposure apparatus of the present invention illuminates a pattern of a first object with ultraviolet light from a laser device and exposes a second object with the ultraviolet light which has passed through the first object, wherein the laser device includes a laser light generation section which generates single wavelength laser light in a wavelength range of from an infrared region to a visible region, an optical splitter which splits the laser light into a plurality of laser light beams, a plurality of optical fiber amplifiers which respectively and independently amplify the plurality of split laser light beams, a wavelength conversion section which performs wavelength conversion of the amplified laser light beams, and the laser device includes a regulator which regulates an amplification gain at least one of the plurality of the optical fiber amplifiers so that outputs of the plurality of amplified laser light beams are substantially uniformalized.

The exposure apparatus in each of the above-described aspects of the present invention allows use of a light source which is small and which has a narrow oscillatory spectrum such as, for example, a distributed feed back (DFB) semiconductor laser controlled in oscillation wavelength or a fiber laser as the laser light generation section in the laser device. High-output single wavelength ultraviolet light which has a narrow spectral width can be obtained in the following manner. Single wavelength laser light output from the laser light generation section is amplified using the plural stages of optical fiber amplifiers; and thereafter, the laser light is converted into ultraviolet light through the nonlinear optical crystal. As such, the present invention enables the provision of the exposure apparatus including the laser device which is small and which has high maintainability.

In this case, for example, one of the following amplifiers can be used for the optical fiber amplifier: an erbium(Er)-doped fiber amplifier(EDFA), a ytterbium(Yb)-doped fiber amplifier(YDFA), a praseodymium(Pr)-doped fiber amplifier(PDFA), and a thulium(Tm)-doped fiber amplifier (TDFA). However, when high-intensity light is propagated through the optical fiber amplifiers, an undesirable case can occur in which the wavelength width expands according to nonlinear effects.

During the nonlinear effects working, the longer the fiber length, the wider the wavelength width expansion due to SPM (self phase modulation) and SRS (stimulated raman scattering). For example, in a simple model, the wavelength width expansion due to the SPM is proportional to the fiber length. Therefore, reducing the fiber length enables the wavelength width expansion due to the SPM to be mitigated. When an optical intensity at which the SPM begins to occur is used as an SRS threshold, the SRS threshold is inversely proportional to the fiber length. Therefore, effects of mitigating the wavelength width expansion in the output of the optical fiber amplifier can be obtained by reducing the fiber length to increase the SRS threshold and to thereby cause SRS not to easily occur. Thus, for either of the SPM and SRS, the wavelength width expansion can be reduced by reducing the fiber length.

Either the SRS or SBS (stimulated brillouin scattering) is a phenomenon in which light propagating through a fiber is caused by phonon to scatter into the phonon sideband. The wavelength of light caused to scatter into the phonon sideband expands in width with respect the original wavelength; specifically, the wavelength is expanded in width to be different from the original wavelength by the wavelength of the phonon. In addition, because of the SRS and SBS, the light scattered into the phonon sideband is amplified coherently, thereby increasing the intensity thereof. Particularly, when noise of a wavelength equivalent to the phonon sideband exists, since the noise works as a seed (seed light) to cause amplification, the intensity of the scattering light is increased. This causes the influence of the wavelength width expansion due to the SRS and the SBS to be conspicuous. Accordingly, the noise working as the seed needs to be reduced to reduce the influence of the SRS and the SBS.

In consideration of the above, according to the above-described present invention, the narrow band filter and the isolator are inserted in the portion where the plural stages of optical fibers are coupled to thereby reduce the noise due to amplified spontaneous emission (which hereinbelow will be referred to as "ASE"). This enables the SRS and SBS to be reduced.

As another method, the ASE can also be reduced by inserting the isolator between the plural stages of optical fiber amplifiers. Thereby, the influence of the SRS and SBS can be reduced. In addition, by inserting the narrow band filter between the plural stages of optical fiber amplifiers, the ASE can be reduced, and light caused to scatter according to the Raman scattering can be blocked by the narrow band filter. Consequently, scattering light can be prevented from being amplified coherently, and the SRS influence is reduced.

In these cases, either the isolator or the narrow band filter prevents the excitation light from being propagated. As such, the bypass member is provided to allow the excitation light to propagate to the optical fiber amplifiers provided forwardly and backwardly of the isolator or the narrow band filter. For the bypass members, the coupling-dedicated wavelength division multiplexing (WDM) devices are used. Thereby, the excitation light can be efficiently used.

In addition, the wavelength width expansion due to nonlinear effects can be reduced in a configuration in which optical fiber amplifiers having a two-way excitation construction are coupled and the narrow band filter is disposed in the coupled portions. Moreover, in a configuration where the film for reflecting the excitation light is formed on one end surface of the optical fibers coupled to both ends of the narrow band filter, the excitation light injected from both the front and rear sides are individually reflected thereby to cause the excitation light to reversely propagate and to return to the original optical fiber amplifiers. This avoids the necessity of providing, for example, WDM-dedicated multiplexers for the aforementioned excitation-light bypassing. Consequently, the configuration can be simplified, and the problem of WDM insertion loss can be avoided.

Furthermore, another method is usable. For the waveform of the pulsed light converted in the optical modulation section, the method uses a waveform having a width (for example, in a range of from 2 to 5 ns) that is several times longer than a pulsewidth for obtaining a predetermined wavelength width with the finally generated ultraviolet light, i.e., a pulsewidth which is determined depending on the transfer limit in a required frequency width and that is controlled to maximize the pulse transient time. In this case, the pulsewidth of the output light is reduced by using bleaching of the gain in the optical fiber amplifier at the last stage.

Specifically, since the frequency expansion due to the SPM is proportional to timewise variations in optical intensity, the longer the pulse transient time in which the timewise variations in optical intensity are slow, the less the frequency expansion. As such, the SPM influence can be reduced by using a pulse of which transient time is long. On the other hand, a trade off occurs such that as the pulsewidth becomes wider, the SBS influence increases. In a simple model, the threshold of the optical intensity at which the SBS occurs is inversely proportional to the pulsewidth. However, the gain bleaching occurs in the last-stage optical fiber amplifier that is most problematic in SBS. As such, the pulsewidth of the output light is reduced, and the pulsewidth is wide, thereby reducing adverse effects.

In addition, still another method is usable. The method is such that to mitigate SRS propagation to the transmitting optical fiber from the high-output last-stage optical fiber, the narrow band filter is inserted in the coupled portion thereof. With the narrow band filter, the ASE can be reduced, the SRS propagation can be mitigated, and the wavelength width expansion of the propagated light can therefore be reduced.

For example, when an erbium-doped fiber amplifier (EDFA) is used for the optical fiber amplifier, light having a wavelength of (980±10) nm or (1480 nm±30 nm) can be used as the excitation light. However, when the 980 nm band is used for the excitation light, the gain per unit length is higher than that when the 1480 nm band is used. As such, with the 980 nm band being applied, the fiber length can be reduced, and consequently, the ASE primarily causing noise can be reduced. That is, in comparison to the 1480 nm band excitation, the 980 nm band excitation enables noise by the optical fiber amplifier can be reduced lower.

A (970±10) nm light may be used as the excitation light for either an ytterbium(Yb)-doped fiber or an erbium/ytterbium-codoped fiber.

Preferably, each of the above-described laser devices is configured to further include an optical splitter which splits the laser light generated by the laser light generation section into a plurality of laser light beams, and, in this configuration, optical amplification sections are independently provided for the plurality of split laser beams respectively, and the wavelength conversion section collects fluxes of laser beams output from the plurality of optical amplification sections and performs wavelength conversion thereof. Thus, the laser light split by the optical splitters are sequentially imparted with predetermined differences in optical path lengths and therefore, the spatial coherence of the laser light finally bundled can be reduced. Moreover, since each of the laser light beams is generated by the common laser light generation section, the spectral linewidth of the finally obtained ultraviolet light is narrow.

Further, the laser light can be modulated by a light modulator and the like at a high frequency of, for example, about 100 kHz. Moreover, each of the pulsed light beams is an aggregate of, for example, 100 pulses of light with predetermined time intervals. As such, in comparison to a case where an excimer laser light (having a wavelength of several kHz) is used, the pulse energy can be reduced to about 1/1000 to 1/10000 to obtain the same illuminance. Therefore, when the above-described laser device is used as an exposure light source, transmittance variations due to, for example, compaction, can substantially be eliminated, and stable and high-accuracy exposure can be implemented.

Concerning the configuration of the wavelength conversion section of the present invention, ultraviolet light formed of a harmonic wave having a frequency of an arbitrary integer multiple (a wavelength of an integer division of 1) with respect to that of the fundamental wave can be easily output through combination of second-order harmonic generation (SHG) by a plurality of nonlinear optical crystals and sum frequency generation (SFG).

For example, ultraviolet light substantially having the same wavelength of 193 to 194 nm as that of an ArF excimer laser can be obtained in a configuration in which a laser light whose wavelength is limited to 1.5 μm. particularly to a range of from 1.544 to 1.552 μm is irradiated from the laser light generation section, and the eighth-order harmonic wave of the fundamental wave thereof is generated in the wavelength conversion section. Moreover, ultraviolet light substantially having the same wavelength of 157 to 158 nm as that of an $F_2$ laser can be obtained in a configuration in which laser light whose wavelength is limited to near 1.5 μm, particularly to a range of from 1.57 to 1.58 μm is irradiated from the laser light generation section, and the tenth-order harmonic wave of the fundamental wave thereof is generated in the wavelength conversion section. Similarly, ultraviolet light substantially having the same wavelength as that of an $F_2$ laser can be obtained in a configuration in which laser light whose wavelength is limited to near 1.1 μm, particularly to a range of from 1.099 to 1.106 μm is irradiated from the laser light generation section, and the seventh-order harmonic wave of the fundamental wave thereof is generated in the wavelength conversion section.

The exposure apparatus of the present invention further includes an illumination system which irradiates a mask with ultraviolet light from the laser device, and a projection optical system which projects an image of a pattern of the mask onto a substrate, wherein the substrate is exposed with the ultraviolet light passed through the pattern of the mask. With the laser device of the present invention being used, the exposure apparatus can be miniaturized overall, and the maintainability thereof is increased.

According to an exposing method of the present invention, the ultraviolet light from the laser device is used as alignment light for an exposure apparatus of, for example, a TTR (through the reticle) method type, of the exposure apparatus. The alignment light can be formed to substantially be continuous light, thereby facilitating the alignment.

Hereinbelow, a first exposure apparatus manufacturing method according to the present invention is a method of manufacturing an exposure apparatus which illuminates a pattern of a first object with ultraviolet light from a laser device and which expose a second object with the ultraviolet light which has passed through the pattern of the first object, wherein the laser device is configured by disposing with a predetermined relationship, a laser light generation section which generates single wavelength laser light in a wavelength range of from an infrared region to a visible region, plural stages of optical fiber amplifiers which serially amplify the laser light generated by the laser light generation section, an optical amplification section including a narrow band filter and an isolator between the plural stages of optical fiber amplifiers, and a wavelength conversion section which performs wavelength conversion of the laser light amplified by the optical amplification section into ultraviolet light by using a nonlinear optical crystal.

A second exposure apparatus manufacturing method according to the present invention is a method of manufacturing an exposure apparatus which illuminates a pattern of a first object with ultraviolet light from a laser device and which exposes a second object with the ultraviolet light which has passed through the pattern of the first object, wherein the laser device is configured by disposing with a predetermined relationship, a laser light generation section which generates single wavelength laser light in a wavelength range of from an infrared region to a visible region; an optical amplification section including plurality of amplifying optical fibers which amplify the laser light generated by the laser light generation section, an excitation-light generating light source which generates a plurality of amplifying excitation light beams, a narrow band filter or an isolator disposed between the plurality of amplifying optical fibers, and a bypass member which passes the excitation light in parallel to the narrow band filter or the isolator; and a wavelength conversion section for performing wavelength conversion of the laser light amplified by the optical amplification section into ultraviolet light by using a nonlinear optical crystal.

Furthermore, a device manufacturing method of the present invention includes a step of transferring a mask pattern onto a substrate by using the exposure apparatus of the present invention.

BRIEF DESCRIPTION OF THE FIGURES IN THE DRAWINGS

BEST MODE FOR CARRYING OUT THE INVENTION

Hereinbelow, an example of a preferred embodiment according to the present invention will be described with reference to the accompanying drawings. The present example represents a configuration in which the present invention is applied to an ultraviolet light generator that can be used as a projection exposure apparatus such as a stepper method or a step-and-scan method, or as a light source for alignment and various tests.

Figures 1A, 1B:
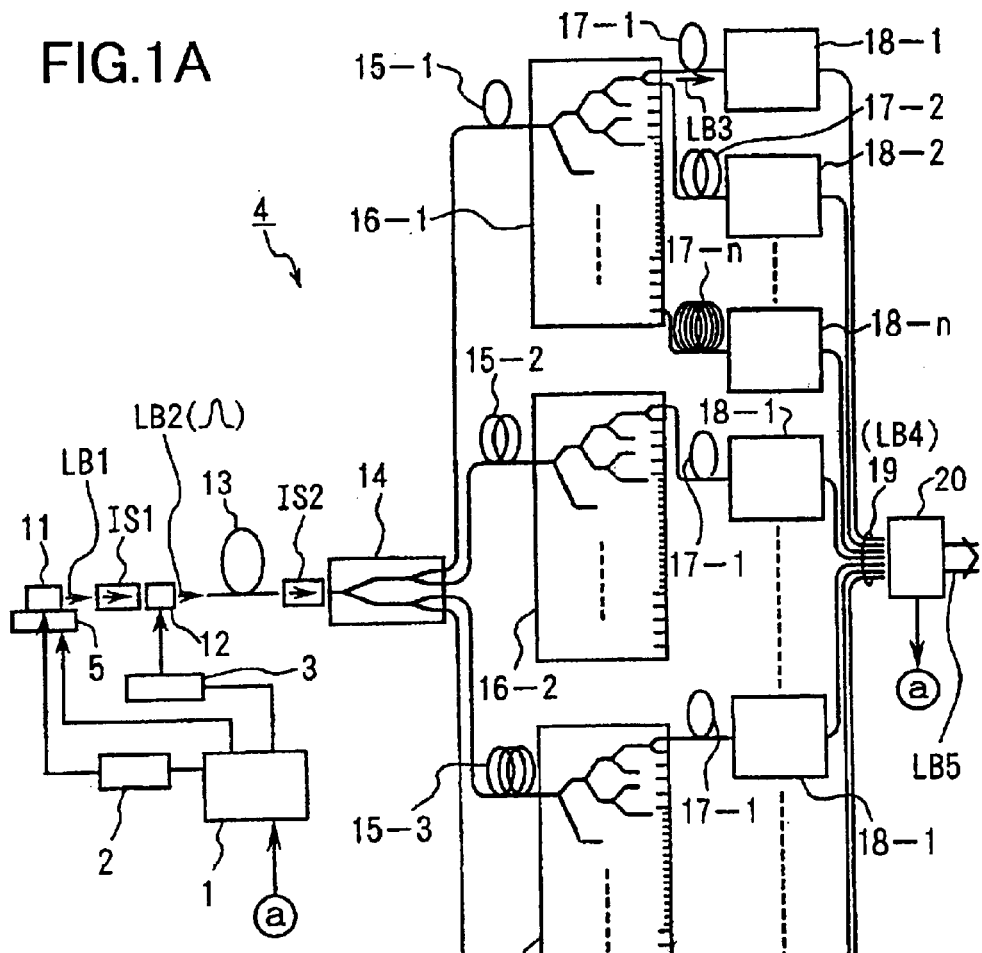
FIGS. 1A and 1B are diagrams showing an example of an ultraviolet light generator according to an embodiment of the present invention.

FIG. 1A shows an ultraviolet light generator according to the present example. Referring to FIG. 1A, a single wavelength oscillatory laser 1, which is provided as a laser light generation section, generates a laser beam LB1 that is formed of a continuous wave (CW) having a narrow spectral width and that has a wavelength of 1.544 $\mu$m. The laser beam LB1 is incident on an optical modulating device 12, which is provided as an optical modulator, via an isolator IS1 provided for blocking reverse light. The laser beam LB1 is converted therein into a laser beam LB2 (pulsed beam), and the laser beam LB2 is then incident on an optical splitting amplifier section 4.

The laser beam LB2 incident on the optical division amplifier section 4 passes through an optical fiber amplifier 13 provided as a front-stage optical amplification section, passes through the optical fiber amplifier 13, and is amplified therethrough. The amplified beam is then incident on a splitter 14 of a planar waveguide type provided as a first optical splitting device via an isolator IS2, and is then split into m laser beams each having the same optical intensity. The letter m represents integer "2" or a greater integer. In the present example, m=4. For the optical fiber amplifier 13, the apparatus uses an erbium-doped fiber amplifier (EDFA) to amplify light having the same wavelength zone (which is near 1.544 $\mu$m in the present example) as that of the laser beam LB1, which generated by the single wavelength oscillatory laser 11. An excitation beam having a wavelength of 980 nm is fed into the optical fiber amplifier 13 via a coupling-dedicated wavelength division multiplexing device (not shown). Excitation beam having a wavelength of (980±10) nm or (1480 nm±30 nm) can be used for the erbium-doped fiber amplifier (EDFA). However, to prevent the increase in wavelength according to nonlinear effects, the (980±10) nm laser beam is preferably used as excitation beam to thereby reduce the fiber length. In comparison to the case where the light in the 1480 nm band, using the (980±10) nm excitation beam is more preferable also in that noise can be reduced occurring in the optical fiber amplifier 13 because of amplified spontaneous emission (ASE). The above is the same for a rear-stage optical fiber amplifier.

The m laser beams that have been output from the splitter 14 are incident on planar-waveguide-type splitters 16-1, 16-2, . . . , and 16-m individually provided as second optical splitting devices via respective optical fibers 15-1, 15-2, . . . , and 15-m each having a different length. Thereby, the m laser beams are each split into n laser beams each having substantially the same optical intensity. The letter n represents "2" or a greater integer; and n=32 in the present example. The first optical splitting device (14) and the second optical splitting devices (16-1 to 16-m) correspond to optical splitters of the present embodiment according to the present invention. Consequently, the laser beam LB1 emitted from the single wavelength oscillatory laser 11 is split overall into n·m laser beams (that is, 128 laser beams in the present example).

N laser beams LB3 output from the splitter 16-1 are incident on optical amplifier units 18-1, 18-2, . . . , and 18-n, individually provided as rear-stage optical amplification sections, via respective optical fibers 17-1, 17-2, . . . , and 17-n each having a different length; and the incident beams are amplified therethrough. The optical amplifier units 18-1 to 18-n each amplify a laser beam having the same wavelength zone (near 1.544 μm in the present example) as that of the laser beam LB1 generated by the single wavelength oscillatory laser 11. Similar to the above, n laser beams output from the other splitter 16-2 to 16-m are incident on optical amplifier units 18-1 to 18-n, individually provided as the rear-stage optical amplification sections, via respective optical fibers 17-1 to 17-n each having a different length; and the incident beams are amplified therethrough.

The laser beams amplified by the m-group optical amplifier units 18-1 to 18-n propagate through extended portions of output terminals of optical fibers (described below) doped with a predetermined matter in the respective optical amplifier units 18-1 to 18-n. The aforementioned extended portions form a fiber bundle 19. The lengths of the m-group n optical fibers forming the fiber bundle 19 are identical to one another. However, the configuration may be such that the fiber bundle 19 is formed bundling, and the laser beams amplified by the optical amplifier units 18-1 to 18-n are transferred to the corresponding optical fibers. Thus, the optical splitting amplifier unit 4 is configured to include the members provided between the optical fiber amplifier 13 and the fiber bundle 19.

Laser beams LB4 having been output from the fiber bundle 19 are incident on a wavelength conversion section 20 including a nonlinear optical device, and is converted thereby into laser beams LB5 each formed of ultraviolet light. The laser beams LBS are output to the outside as alignment light or testing light. As described above, the m-group optical amplifier units 18-1 to 18-n are provided to individually correspond to the optical amplification sections of the present invention. However, a case may be in which the optical fibers in the fiber bundle 19 are included in the optical amplification sections.

Moreover, as shown in FIG. 1B, output terminals 19a of the fiber bundle 19 are bundled such that the m·n optical fibers (128 optical fibers in the present example) tightly contacts one another, and the outer shape thereof is circular in a cross-sectional view. In a practical configuration, however, the outer shape of the output terminals 19a and the number of optical fibers are determined according to, for example, the rear-stage configuration of the wavelength conversion section 20 and use conditions of the ultraviolet light generator of the present example. The clad diameter of each of the optical fibers constituting the fiber bundle 19 is about 125 μm. Accordingly, when 128 optical fibers are bundled circular, a diameter d1 of each of the output terminals 19a can be set to about 2 mm or smaller. The configuration of the optical splitting amplifier section 4 is not limited to that shown in FIGS. 1A and 1B. For example, a time division multiplexer may be used as an optical splitter.

The wavelength conversion section 20 converts the incident laser beam LB4 to a laser beam LB5 formed of either an eighth-order harmonic wave (wavelength: ⅛) or a tenth-order harmonic wave (wavelength: 1/10). The wavelength of the laser beam LB1 output from the single wavelength oscillatory laser 11 is 1.544 μm. Accordingly, the wavelength of the eighth-order harmonic wave is 193 nm, which is the same as that of the ArF excimer laser; and the wavelength of the tenth-order harmonic wave is 154 nm, which is substantially the same as the wavelength (157 nm) of the $F_2$ laser (fluorine laser). Suppose a case occurs in which the wavelength of the laser beam LB5 needs to be approximated closer to the wavelength of the $F_2$ laser. This case can be achieved such that the wavelength conversion section 20 is controlled to generate a tenth-order harmonic wave, and in addition, the single wavelength oscillatory laser 11 is controlled to generate a laser beam having a wavelength of 1.57 μm.

In practice, ultraviolet light substantially having the same wavelength (193 to 194 nm) as that of the ArF excimer laser can be obtained in such a way that the oscillation wavelength of the single wavelength oscillatory laser 11 is regulated to be in a range of from 1.544 to 1.552 μm, and is converted to the eighth-order harmonic wave. Similarly, ultraviolet light substantially having the same wavelength (157 to 158 nm) as that of the $F_2$ laser in such a way that the oscillation wavelength of the single wavelength oscillatory laser 11 is regulated to be in a range of from 1.57 to 1.58 μm, and is converted to the tenth-order harmonic wave. As such, these ultraviolet light generators can be used as inexpensive and easily maintainable light sources in place of the ArF excimer laser source and the $F_2$ laser source.

Alternative other methods may be employed instead of the method of finally obtaining the ultraviolet light having the wavelength that is close to the wavelength zone of the ArF excimer laser or the $F_2$ laser. For example, in one of the alternative methods, an optimal exposure-light wavelength (for example, 160 nm, or the like) is determined according to patterning rules furnished for a manufacturing object such as a semiconductor device; and, for example, the oscillation wavelength of the single wavelength oscillatory laser 11 and the magnification of harmonic waves in the wavelength conversion section 20 are thereby determined so that ultraviolet light having a theoretically optimum wavelength can be obtained. That is, the wavelength of the light generated in the wavelength conversion section 20 may be arbitrary (for example, about 200 nm or shorter), or may be different from the eighth-order and tenth-order harmonic waves; and the configuration of the wavelength conversion section 20 may be arbitrary.

Hereinbelow, the present embodiment will be described in further detail. Referring to FIG. 1A, for the single wavelength oscillatory laser 11 oscillating at a single wavelength, the present example uses, a laser, such as a distributed feedback (DFB) semiconductor laser. The DFB semiconductor laser is characterized by an InGaAsP construction, a 1.544 μm oscillation wavelength, and a 20 mW continuous output (which hereinbelow will be referred to as "CW output"). In addition, the DFB semiconductor laser is configured such that, instead of a Fabry-Pelot resonator, a diffraction grating is formed in a semiconductor laser, in which single longitudinal mode oscillation is performed under any condition. Thus, since the DFB semiconductor laser performs the single longitudinal mode oscillation, the oscillation spectral linewidth can be controlled to be 0.01 pm or less. Alternatively, for the single wavelength oscillatory laser 11, the present example may be configured using a light source such as an erbium(Er)-doped fiber laser capable of generating a laser beam having a wavelength region similar to the above and narrowed bandwidth.

In addition, the output wavelength of the ultraviolet light generator of the present example is preferably fixed to a specific wavelength depending on the usage. As such, the present example includes an oscillation wavelength controller provided to control the oscillation wavelength of the single wavelength oscillatory laser 11, provided as a master oscillator, to be a predetermined wavelength. As in the present example, in the configuration using the DFB semiconductor laser for the single wavelength oscillatory laser 11, the oscillation wavelength can be controlled according to a method of controlling the temperature of the DFB semiconductor laser. This method enables, for example, the oscillation wavelength to be more stably controlled to be a predetermined wavelength, and the output wavelength to be finely tuned.

Ordinarily, a component such as the DFB semiconductor laser is provided over a heatsink, and the components are stored in a package. In the present example, a temperature regulator section 5 (which is formed of, for example, a heating device such as a heater, a heat absorbing device such as a Peltier device, a temperature detecting device, and a thermistor) is fixed to a heatsink attached to the single wavelength oscillatory laser 11 (such as the DFB semiconductor laser). In this configuration, operation of the temperature regulator section 5 is controlled by a control section 1 comprising a computer, and the temperatures of the heatsink and the single wavelength oscillatory laser 11 are thereby controlled with a high accuracy. For example, the temperature in the DFB semiconductor laser can be controlled in units of 0.001° C. Moreover, the control section 1 performs high-accuracy control for power (driving current in the DFB semiconductor laser) for driving the single wavelength oscillatory laser 11 via a driver 2.

The oscillation wavelength of the DFB semiconductor laser has a temperature dependency of about a 0.1 nm/° C. When the temperature of the DFB semiconductor laser is changed by, for example, 1° C., the wavelength is changed by 0.1 nm in the fundamental wave (wavelength: 1544 nm). Accordingly, in the eighth-order harmonic wave (193 nm), the wavelength thereof is changed by 0.1 nm; and in the tenth-order harmonic wave (157 nm), the wavelength thereof is changed by 0.01 nm. When the laser beam LB5 is used for the exposure apparatus, compensation needs to be performed for, for example, errors that can occur according to differences in atmosphere of environments where the exposure apparatus is placed or errors that can occur because of variations in imaging properties. As such, preferably, the laser beam LB5 can preferably be varied by about ±20 pm with respect to the central wavelength. This can be implemented by changing the temperature of the DFB semiconductor laser by about ±1.6° C. for the eighth-order harmonic wave and by ±2° C. for the tenth-order harmonic wave.

For a monitor wavelength used in feedback control when controlling the above-described oscillation wavelength to be a predetermined wavelength, a wavelength that provides sensitivity necessary for desired wavelength control and that has high monitorablility may be selected from post-wavelength-conversion harmonic-wave outputs (such as a second-order harmonic wave, a third-order harmonic wave, and a fourth-order harmonic wave) in the wavelength conversion section 20 (described below). In an event a 1.51-to-1.59 µm DFB semiconductor laser is used for the single wavelength oscillatory laser 11, the third-order harmonic wave of the oscillation laser beam has a wavelength in a range of from 503 nm to 530 nm. This wavelength band corresponds to a wavelength zone wherein iodine-molecule absorption lines are present at a high density. As such, even higher-accuracy wavelength control can be implemented in such a way that an appropriate iodine-molecule absorption line is selected and is locked to the wavelength thereof. The present example is arranged such that a predetermined harmonic wavelength (preferably, the third-order harmonic wave) in the wavelength conversion section 20 is compared with the selected appropriate iodine-molecule absorption line (reference wavelength), and the differential amount of the wavelength is fed back to the control section 1. Then, based on the feedback, the control section 1 controls the temperature of the single wavelength oscillatory laser 11 to cause the differential amount to become a predetermined value. In this case, the control section 1 may be arranged such that the oscillation wavelength of the single wavelength oscillatory laser 11 is positively controlled to vary, and the output wavelength thereof can be tuned.

For example, in an exposure apparatus exposure light source to which the ultraviolet light generator of the present example is applied, the former method, described above, enables the prevention of aberration from occurring with a projection optical system because of wavelength variations. Consequently, the method avoids variations in imaging properties (optical properties such as image quality) to occur during pattern transfer. The latter method, described above, enables compensation for variations in image properties (such as aberrations) of the projection optical system. The variations can occur because of, for example, an elevational difference and an atmospheric difference between a manufacturing site, in which the exposure apparatus is assembled and tuned, and a placement site (delivery site) of the exposure apparatus. The variations can also occur of a difference in environments (such as inter-clean-room atmospheres). This enables reduction in time required for installation of the exposure apparatus in the delivery site. Moreover, the latter method enables compensation for variations of various types that occur during operation of the exposure apparatus. The variations include those in aberrations with an illumination optical system, in projection magnification, and focal position. These variations can occur in association with changes in reticle illumination conditions (specifically, illuminant-energy distributions of exposure illumination light on a pupillary surface of an illumination optical system) according to irradiation of exposure illumination light, atmospheric variations, and illumination optical systems. As such, the latter method enables a pattern image to be transferred on a substrate always in the best imaging condition.

The laser beam LB1, formed of continuous light output from the single wavelength oscillatory laser 11, is converted into the laser beam LB2, formed of a pulsed beam, by use of the optical modulating device 12. The optical modulating device 12 is formed of, for example, an electrooptical modulating device or an acousto-optical modulating device. Operation of the optical modulating device 12 is controlled by the control section 1 through the driver 3. Hereinbelow, a description will be made with reference to an example of the present example configuration in which the optical modulating device 12 performs the modulation into a pulsed beam characterized by a pulsewidth of 1 ns and a repetition frequency of 100 kHz (pulse cycle: 10 µs). As a result of the optical modulation, the peak output power of the pulsed beam produced from the optical modulating device 12 becomes 20 mW, and the average output power thereof becomes 2 µW. In the example case, no loss is assumed to occur because of insertion of the optical modulating device 12. However, a loss of the insertion occurs in practice. For example, with a loss of −3 dB, the value of the peak output is thereby reduced to 10 mW, and the value of the average output is thereby reduced to 1 µW.

When using an electrooptical modulating device for the optical modulating device 12, the electrooptical modulating device is preferably of a type (such as a two-electrode-type modulator) that has an electrode structure subjected to chirp compensation. The aforementioned modulator is preferably used to reduce the wavelength expansion of a semiconductor-laser output, which is caused by chirp occurring according to a timewise variation in the refractive index. In addition, in the optical fiber amplifiers in the optical amplifier units 18-1 to 18-n, the amplification factor can be can be prevented from being reduced because of influence of ASE (amplified spontaneous emission) noise. The above prevention can be achieved by setting the repetition frequency to a level of 100 kHz or higher. Moreover, suppose the illuminance of ultraviolet to be finally output may be the same level as that of a conventional excimer laser beam (of which the pulse frequency is a level of several kHz). In this case, as in the present example, the pulse frequency is increased, and individual pulsed beams are, for example, an aggregate of 128 delayed pulsed beams. Thereby, the per-pulse energy can be reduced to a level of $\frac{1}{1000}$ to $\frac{1}{10000}$ to reduce variations, which can occur by compaction and the like, in refractive index of an optical member (such as a lens). For this reason, the modulator is preferably configured as described above.

Furthermore, a semiconductor laser or the like can be caused to generate output light through pulse oscillation by controlling the current of the laser. As such, the present example preferably uses the current (power) control for the single wavelength oscillatory laser 11 (such as the DFB semiconductor laser) and the optical modulating device 12 in association. The power control for the single wavelength oscillatory laser 11 is performed to oscillate a pulsed beam having a pulsewidth of, for example, a level of 10 to 20 ns.

Concurrently, the optical modulating device 12 is used to take out a part of the pulsed beam. Thus, the present example performs modulation into a pulsed beam having a pulsewidth of 1 ns.

In the above-described manner, the configuration of present example is enabled to easily generate the pulsed beam with the narrower pulsewidth, in comparison to the configuration using only the optical modulating device 12. In addition, the configuration of the present invention is enabled to more easily control, for example, the pulsed-beam oscillation interval, and activation and termination of the oscillation. Particularly, the associated use of the power control and the single wavelength oscillatory laser 11 is preferable in a case where the extinction ratio is not high enough even when only the optical modulating device 12 is used to cause the pulsed beam to be in the off state.

The pulsed beam output thus obtained is then coupled to the erbium-doped optical fiber amplifier 13 on the initial stage, and 35 dB (3162 times) amplification is performed thereby. At this stage, the pulsed beam is amplified to have a peak output power of about 63 W and an average output power of about 6.3 mW. In the above-described configuration, a multistaged optical fiber amplifier may be used to replace the optical fiber amplifier 13.

The output of the initial-stage optical fiber amplifier 13 is first parallely split using the splitter 14 into four outputs for channels 0 to 3 (in the present example, m=4). Outputs of the respective channels 0 to 3 are then couple to the optical fibers 15-1 to 15-4 having the lengths different from one another. Thereby, delay times corresponding to the optical fiber lengths are allocated for the outputs of the optical fibers 15-1 to 15-4. For example, in the present embodiment, the propagation rate of light in each of the optical fibers is assumed to be $2\times10^8$ m/s. The optical fibers 15-1 to 15-4 respectively having lengths of 0.1 m, 19.3 m, 38.5 m, and 57.7 m are coupled to the channels 0, 1, 2, and 3, respectively. In this case, the delay of light between the adjacent channels at an exit terminal of each of the optical fibers is 96 ns. For the convenience of description, the optical fibers 15-1 to 15-4 thus used for delaying the light are each called a "delay fiber".

Subsequently, the outputs of the four delay fibers are further parallely split by the splitters 16-1 to 16-4 into n outputs (in the present example, n=32) (by each of the splitters for channels 0 to 31). That is, the outputs are split into the total of 4×32 (=128) channels. Then, the respective optical fibers 17-1 to 17-32 (delay fibers) each having a different length are coupled to output terminals of the channels 0 to 31 to allocate a 3-ns delay time between the adjacent channels. That is, a 93-ns delay time is allocated for the channel 31. On the other hand, the 96-ns delay time is allocated for the first to fourth splitters 16-1 to 16-4 at the time of input. Consequently, at output terminals of the total 128 channels provided overall, the pulsed beam having the 3-ns delay time between the adjacent channels can be obtained.

As a result of the above, the spatial coherence of the laser beam LB4, which is to be output from the fiber bundle 19, is reduced on the order of $\frac{1}{128}$, in comparison to a case where a cross-sectional shape of the laser beam LB1 to simply be output from the single wavelength oscillatory laser 11 is enlarged. As such, the present example exhibits an advantage in that the amount of speckles occurable when the finally obtainable laser beam LB5 is used as exposure light is very small.

As described above, according to the splitting process and the delay-time allocation, the present example enables the pulsed beams having the 3-ns delay time between the adjacent channels to be obtained at the output terminals of the total 128 channels. The pulsed beam observed at each of the output terminals has the same frequency of 100 kHz (pulse cycle: 10 $\mu$s) as that of the pulsed beam modulated by the optical modulating device 12. Accordingly, in view of the overall laser light generation section, repetition takes place at a cycle of 100 kHz such that 128 pulses are generated at 3-ns intervals, and a subsequent pulse train is then generated after an interval of 9.62 $\mu$s.

In the present embodiment, description has been made with reference to the example in which the split number is 128, and the relatively short delay fibers are used. As such, a non-emission interval of 9.62 $\mu$s occurs between the individual pulse trains. However, the pulse intervals can be completely equalized in such a way that the split numbers m and n are increased, or appropriately longer delay fibers are used, or a combination thereof is employed.

According to the above, it can be viewed that a time division multiplexing means (TDM means) is configured overall by the splitter 14, optical fibers 15-1 to 15-m, splitters 16-1 to 16-m, and m-group optical fibers 17-1 to 17-n of the present example. In the present example, the time division multiplexing means is configured of two stages of the splitters. However, the time division multiplexing means may be configured of three or more stages of splitters; or alternatively, it may be configured only of one stage of splitters while the split number is reduced. Moreover, while the splitters 14 and 16-1 to 16-m are of a planar waveguide type, the configuration may use splitters of a different type, such as fiver splitters or beam splitters using a partial transmission mirror.

In addition, the present example is capable of tuning the oscillation timing, i.e., a repetition frequency f by controlling the timing of a driving voltage pulse applied to the optical modulating device 12. Moreover, in a case where output variations can occur with the pulsed beam according to a change in the oscillation timing, the arrangement may be made such that the magnitude of the driving voltage pulse, which is to be applied to the optical modulating device 12, is synchronously tuned to compensate for the output variations. In this case, the arrangement may be such that the pulsed-beam output variations are compensated for only through the use of oscillation control of the single wavelength oscillatory laser 11 or through the associated use thereof with the above-described control of the optical modulating device 12.

Referring to FIG. 1A, the laser beams passed through the m-group delay fibers (optical fibers 17-1 to 17-n) are incident on the respective optical amplifier units 18-1 to 18-n, and are amplified thereby. The individual optical amplifier units 18-1 to 18-n of the present example have optical fiber amplifiers. However, as in the case of, particularly, the last-stage optical fiber amplifier, when high-intensity light propagates through the optical fibers, the wavelength width of the propagated light is expanded by influences of, for example, SPM (self phase modulation), SRS (stimulated raman scattering), and SBS (stimulated brillouin scattering), which are attributable to the optical-fiber nonlinear effects. Hereinbelow will be described an example configuration that mitigates the wavelength width expansion by reducing the influence of the nonlinear effects. While description given hereinbelow will cover several example configurations of an optical amplifier unit that may be used for the optical amplifier unit 18-1, the example configurations may similarly be used for the other optical amplifier units 18-2 to 18-n.

Figure 2:
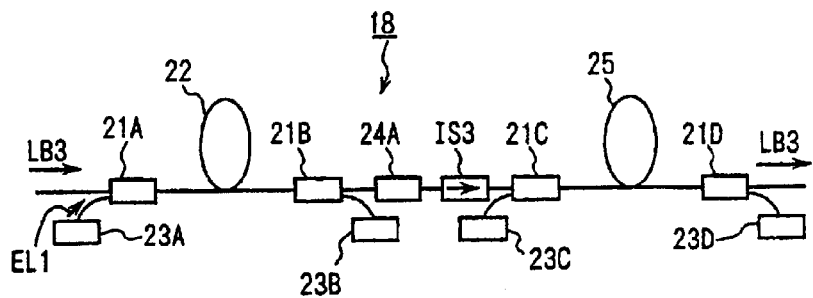
FIG. 2 is a diagram showing a first configuration example of optical amplifier units 18-1 to 18-n shown in FIGS. 1A and 1B.

FIG. 2 shows a first configuration example of an optical amplifier unit 18. Referring to FIG. 2, the optical amplifier unit 18 shown therein is basically configured to include two stages of optical fiber amplifiers 22 and 25 being coupled. The individual optical fiber amplifiers 22 and 25 are formed of erbium-doped fiber amplifiers (EDFAs). Each of the optical fiber amplifiers 22 and 25 may also be called an "amplifying optical fiber". Two end portions of the first-stage optical fiber amplifier 22 are coupled to wavelength division multiplexing devices 21A and 21B (each of which hereinbelow will be referred to as a "WDM device"). The respective WDM devices 21A and 21B feed an excitation beam EL1 and another excitation beam forwardly and backwardly to the optical fiber amplifier 22. The excitation beam EL1 is fed from a semiconductor laser 23A, provided as a laser light source; and the other laser beam is fed from a semiconductor laser 23B, provided as a laser light source. Similarly, two end portions of the second-stage optical fiber amplifier 25 are coupled to coupling-dedicated WDM devices 21C and 21D. The respective WDM devices 21C and 21D forwardly and backwardly feed excitation beams, fed from semiconductor lasers 23C and 23D, to the optical fiber amplifier 25. Thus, each of the optical fiber amplifiers 22 and 25 is of a two-way excitation type.

Each of the optical fiber amplifiers 22 and 25 amplifies light having a wavelength in a range of, for example, from about 1.53 to 1.56 μm, which is inclusive of the wavelength of the incident laser beam LB3 (in the present example, the wavelength thereof is 1.544 μm). A narrow band filter 24A and an isolator IS3 for blocking reverse light are disposed in a boundary portion between the optical fiber amplifiers 22 and 25, more specifically, between the WDM devices 21B and 21C. For the narrow band filter 24A, either a multilayer film filter or a fiber bragg grating may be used.

In the present example, the laser beam LB3 from the optical fiber 17-1 shown in FIG. 1A is led via the AM device 21A to be incident on the amplifying optical fiber 22, and is amplified thereby. Then, the laser beam LB3 amplified by the amplifying optical fiber 22 is incident on the amplifying optical fiber 25 via the WDM device 21B, the narrow band filter 24A, the isolator IS3, and WDM device 21C; and the incident laser beam LB3 is thereby amplified again. Via the WDM device 21D, the amplified laser beam LB3 propagates through one of optical fibers that constitute the fiber bundle 19 shown in FIG. 1A(the aforementioned optical fiber may be an extended portion of an output terminal of the amplifying optical fiber 25).

The total of amplification gains according to the second-stage optical fiber amplifiers 22 and 25 is 46 dB (39,810 times) as one example. When the total number of channels (m·n pieces) output from the splitters 16-1 to 16-m shown in FIG. 1B is 128, and the average output power of each of the channels is about 50 μm, the average output power of all the channels is about 6.4 mW. When a laser beam of each of the channel is amplified at about 46 dB, the average output power of the laser beam output from each of the optical amplifier units 18-1 to 18-n is about 2 W. When the above is assumed to have been pulsed at a pulsewidth of 1 ns, and a pulse frequency of 100 kHz, the peak output power of each of the laser beams is 20 kW. Also, the average output power of the laser beam Lb4 output from the fiber bundle 19 is about 256 W.

In the present example, coupling losses in the splitters 14 and 16-1 to 16-m shown in FIG. 1A are not taken into consideration. However, even when the coupling losses occur, the output powers of the laser beams of the individual channels can be unformed to be the above-described value (for example, the peak output power of 20 kW). This can be achieved by increasing at least one of the amplification gains obtained according to the optical fiber amplifiers 22 and 25 by the amount of the loss. In addition, the value of the output power (output power of the fundamental wave) of the single wavelength oscillatory laser 11 shown in FIG. 1A can be controlled larger or smaller than the aforementioned value. This can be achieved by controlling the amplification gains obtained according to the optical fiber amplifiers 22 and 25.

Referring to the example configuration shown in FIG. 2, the narrow band filter 24A removes ASE (amplified spontaneous emission) light occurring in each of the optical fiber amplifier 13 shown in FIG. 1A and the amplifying optical fiber 22 shown in FIG. 2, and lets the laser beam (having a wavelength width of 1 pm or less) output from the single wave length oscillatory laser 11 shown in FIG. 1A to transmit. Thereby, the narrow band filter 24A substantially makes the wavelength width of the transmitted beam to be a narrow band. This enables the amplification gain of the laser beam to be prevented from being reduced by the incidence of the ASE light. In this case, the narrow band filter 24A preferably has a transmission wavelength width of about 1 pm. However, since the wavelength width of the ASE light is several tens of nm, the ASE light can be removed not to cause a problem in practice even by using a currently available narrow band filter with a transmission wavelength width of about 100 pm.

Suppose the output wavelength of the single wavelength oscillatory laser 11 in FIG. 1A is positively changed. In this case, while the narrow band filter 24A may be replaced according to the output wavelength. However, preferably, a narrow band filter having a transmission wavelength width (equivalent to a variable range (about ±20 pm, as mentioned above as an example, for an exposure apparatus) is used.

Further, isolator IS3 reduces the influence of reverse light attributed to nonlinear effects of the optical fibers. Moreover, in the example configuration shown in FIG. 2, the ASE noise is reduced by use of the narrow band filter 24A and the isolator IS3. Thereby, the influences of SRS (stimulated raman scattering) and SBS (stimulated brillouin scattering), which are nonlinear effects other than those of the last-stage optical fiber amplifier 25, are also reduced. Consequently, the wavelength width expansion is mitigated. The optical amplifier unit 18 may be configured by coupling three or more stages of optical fiber amplifiers. Also in this case, the narrow band filter 24A and the isolator IS3 are preferably inserted into the boundary portion between the two adjacent optical fiber amplifiers in the overall configuration.

In the present example, since a large number of the output beams of optical amplifier unit 18 are bundled and are used in the bundled state, the intensities of the individual output beams are preferably homogenized. This can be implemented in, for example, the following manner. A part of the laser beam LB3 output from the WDM device 21D is isolated, the isolated light is photoelectrically converted, and the luminous quantities of laser beams LB3 to be output are thereby monitored. Then, outputs of excitation light sources (semiconductor lasers 23A to 23D) in each of the optical amplifier units 18 are controlled so that the aforementioned luminous quantities are substantially equal to one another in all the optical amplifier units 18.

Figure 3:
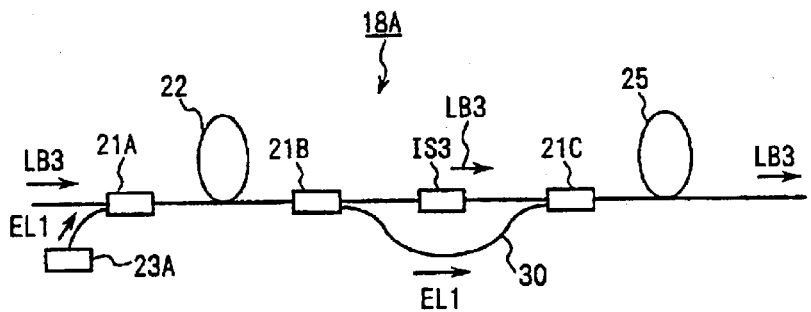
FIG. 3 is a diagram showing a second configuration example of optical amplifier units 18-1 to 18-n.

Hereinbelow, a second example configuration of an optical amplifier unit 18A will be described with reference to FIG. 3. FIG. 3 shows the configuration by using the same reference symbols for portions corresponding to those shown in FIG. 2; and detailed descriptions are omitted herefrom regarding the corresponding portions. Referring to FIG. 3, also the optical amplifier unit 18A is configured to include optical fiber amplifiers 22 and 25 being coupled thereto. An excitation beam EL1 from a semiconductor laser 23A is forwardly fed to the front-stage amplifying optical fiber 22 via a WDM device 21A. In the direction from the amplifying optical fiber 22 to the optical fiber amplifier 25, the configuration includes a WDM device 21B, an isolator IS3 and a WDM device 21C that are coupled in that order. In addition, a bypass-dedicated optical fiber 30 is coupled between the coupling-dedicated WDM devices 21B and 21C.

In the present example, an incident laser beam LB3 is amplified by the amplifying optical fiber 22, then passes through the isolator IS3, and is then amplified by the optical fiber amplifier 25. In this case, the excitation beam EL1 passed through the amplifying optical fiber 22 passes through the rear-stage. As such, while the configuration is simplified by reducing excitation light sources, a high amplification gain can be obtained also in the amplifying optical fiber amplifier 25. In addition, since the ASE can be reduced by using the isolator IS3, also the influences of SRS and SBS are reduced.

Figure 4:
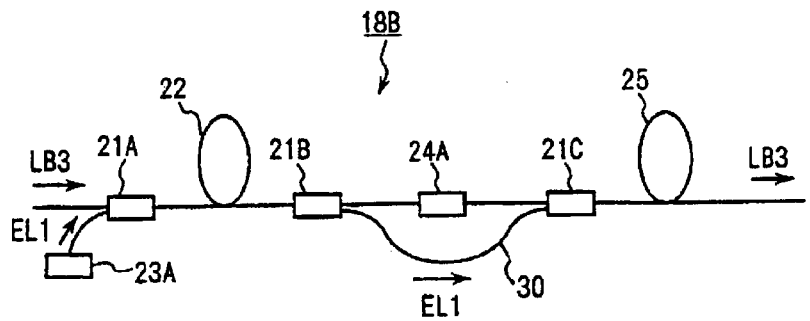
FIG. 4 is a diagram showing a third configuration example of optical amplifier units 18-1 to 18-n.

Hereinbelow, a third example configuration of an optical amplifier unit 18B will be described with reference to FIG. 4. FIG. 4 shows the configuration by using the same reference symbols for portions corresponding to those shown in FIG. 3; and detailed descriptions are omitted herefrom regarding the corresponding portions. The optical amplifier unit 18B is configured such that the isolator IS3 between two stages of the optical fiber amplifiers 22 and 25 in the optical amplifier unit 18A shown in FIG. 3 is replaced by the narrow band filter 24A. Also in this configuration, the ASE can be reduced. In addition, the narrow band filter 24A blocks light scattered because of the Raman scattering in the optical fiber. As such, the scattering light is inhibited from being amplified to be coherent, thereby reducing the SRS influences. Also in the present example, the excitation beam EL1 is also fed to the optical fiber amplifier 25. For the narrow band filter 24A, particularly, a multilayer film filter or a fiber Bragg grating is preferably used to reduce noise.

Figure 5:
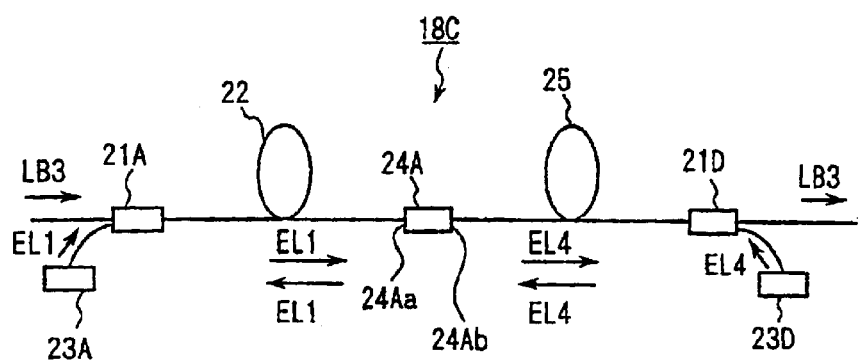
FIG. 5 is a diagram showing a fourth configuration example of optical amplifier units 18-1 to 18-n.

Hereinbelow, a fourth example configuration of an optical amplifier unit 18C will be described with reference to FIG. 5. FIG. 5 shows the configuration by using the same reference symbols for portions corresponding to those shown in FIG. 2; and detailed descriptions are omitted herefrom regarding the corresponding portions. The optical amplifier unit 18C shown in FIG. 5 is configured by omitting the WDM devices 21B and 21C, the excitation-dedicated semiconductor lasers 23B and 23C, and the isolator IS3 from the optical amplifier unit 18 shown in FIG. 2. In addition, in the configuration shown in FIG. 5, a high reflectance film is coated on end surfaces of the optical fibers coupled to two end surfaces 24Aa and 24Ab of the narrow band filter 24A. The aforementioned high reflectance film is coated to reflect the excitation beam EL1 from the semiconductor laser 23A and an excitation beam EL4 from the semiconductor laser 23D. Since the optical fiber amplifiers 22 and 25 of the present example are each formed of an erbium-doped fiber, a laser beam having a wavelength of 980 nm is used for each of the excitation beams EL1 and EL4. For this reason, the high reflectance film against the 980-nm beam is coated on the end surfaces coupled to the two ends of the narrow band filter.

In the example configuration, the incident laser beam LB3 passes from the amplifying optical fiber 22 to the narrow band filter 24A, and further passes through the optical fiber amplifier 25. The excitation beam EL1 on the one hand forwardly passes through the amplifying optical fiber 22 and performs excitation thereof. Thereafter, the excitation beam EL1 is reflected by the surface 24Aa of the narrow band filter 24A, then excites the reamplifying optical fiber 22. The excitation beam EL4 on the other hand backwardly passes through the optical fiber amplifier 25 and performs excitation thereof. Thereafter, the excitation beam EL4 is reflected by the surface 24Ab, and excites the reamplifying optical fiber amplifier 25. As such, high amplification gains can be obtained with the optical fiber amplifiers 22 and 25.

In the above-described case, since the narrow band filter 24A is used, the ASE is reduced, and the SRS influence is reduced. Furthermore, in comparison with the example configuration shown in FIG. 4, the present example configuration shown in FIG. 5 avoids the necessity of inserting the bypass-dedicated WDM devices 21B and 21C. This enables the configuration to be simplified, and avoids the problem of WDM-device insertion loss.

Figure 6:
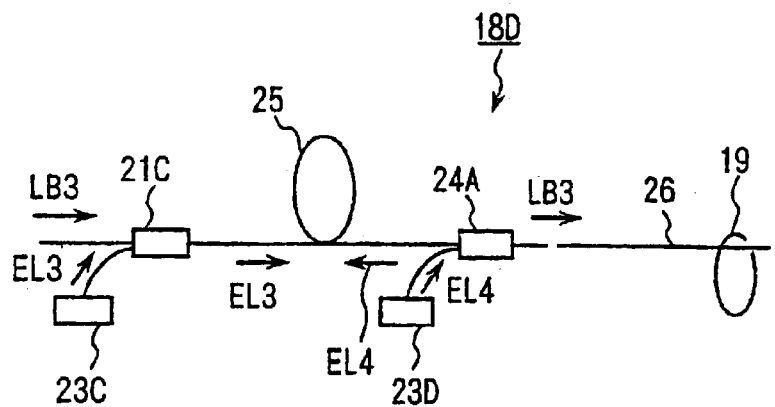
FIG. 6 is a diagram showing a fifth configuration example of optical amplifier units 18-1 to 18-n.

Hereinbelow, a fifth example configuration of an optical amplifier unit 18D will be described with reference to FIG. 6. FIG. 6 shows the configuration by using the same reference symbols for portions corresponding to those shown in FIG. 2; and detailed descriptions are omitted herefrom regarding the corresponding portions. The optical amplifier unit 18D shown in FIG. 6 is configured to include the coupling-dedicated WDM device 21C and the narrow band filter 24A that are coupled in the front and back of the optical fiber amplifier 25. In this configuration, an excitation beam EL3 from the semiconductor laser 23C is fed to the optical fiber amplifier 25 via the WDM device 21C. The narrow band filter 24A is shared as a coupling-dedicated wavelength division multiplexing device (WDM device). The excitation beam EL4 from the semiconductor laser 23D is fed to the optical fiber amplifier 25 via the narrow band filter 24A. In the present example, the output terminal of the narrow band filter 24A is coupled to an undoped optical fiber 26 that constitutes the fiber bundle 19 shown in FIG. 1(a). The amplifying optical fiber 22 shown in FIG. 2 and an exciting member therefor (not shown) are coupled to a front stage of the WDM device 21C.

Referring to FIG. 6, the incident laser beam LB3 is amplified by the optical fiber amplifier 25, and then propagates through the undoped optical fiber 26 via the narrow band filter 24A. In this case, since the narrow band filter 24A is shared as the WDM device, the configuration is thereby simplified. Moreover, since the narrow band filter 24A is used, the influence of SRS (stimulated raman scattering) the undoped optical fiber 26 is reduced. Consequently, the wavelength width expansion can be mitigated.

Hereinbelow, another example of the present embodiment according to the present invention will be described with reference to FIGS. 1A, 1B, 2, 7A, 7B, and 7C. According to the above-described embodiment, the pulsewidth of the laser beam output from the optical modulating device 12 shown in FIG. 1A is set to about 1 ns. With the pulsewidth which is thus short, when the peak output power is increased, an unexpected case can occur in which the frequency expansion is increased due to SPM (self phase modulation), particularly in the rear-stage optical fiber amplifier. As such, in the present example, the width of the output pulse in the optical modulating device 12 is set to a width that is several times a pulsewidth (about 1 ns in the present example) which is determined depending on the transfer limit in a required frequency width, for example, in a range of from 2 to 5 ns, and the pulse waveform is controlled to maximize the pulse transient time.

Figure 7A:
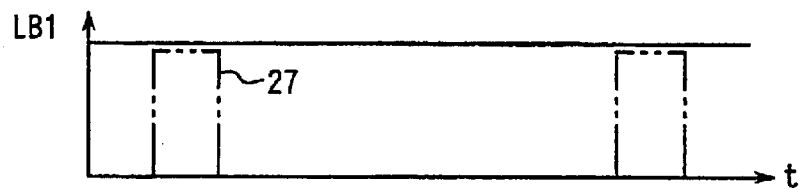
FIGS. 7A, 7B and 7C are diagrams showing waveforms of laser beams in individual portions of another example according to the present embodiment of the present invention.
Figure 7B:
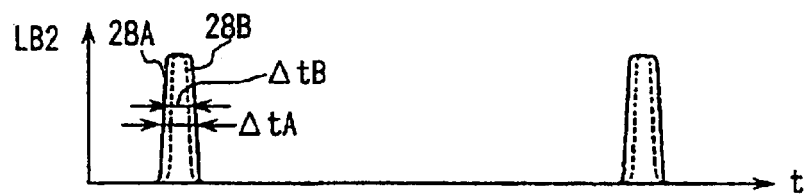
Figure 7C:
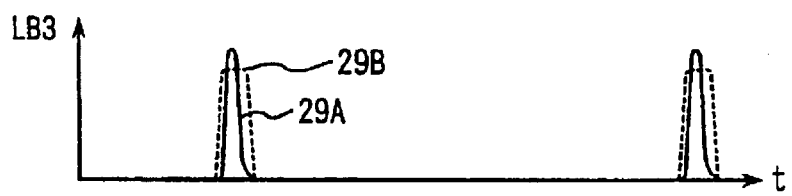

FIGS. 7A, 7B and 7C show example pulse waveforms in individual portions. Intensity variations with respect a time t of the laser beam LB2 output from the optical modulating device 12 shown in FIG. 1A are represented as a waveform 28A shown by a solid line in FIG. 7B. FIG. 7B shows that a pulsewidth ΔtA of the waveform 28A is set to a level of two times a pulsewidth ΔtB of a waveform 28B, shown by a dotted line, which is determined depending on the transfer limit in a desired frequency width. In this case, the laser beam LB1 output from the single wavelength oscillatory laser 11 shown in FIG. 1A may be a CW wave as shown by the solid line in FIG. 7A. However, when the laser beam LB1 is controlled to be a pulsed beam having a width larger than the pulsewidth ΔtA as a waveform 27 shown by a double-dotted chain line, use efficiency of the laser beam can be improved.

In addition, suppose the optical amplifier unit 18 shown in FIG. 2 is assumed to be used for the optical amplifier unit 18-1 shown in FIG. 1A. In this case, when the pulsewidth of the laser beam LB2 is increased as described above, while the SPM influence is reduced particularly in the last-stage optical fiber amplifier 25, the SBS (stimulated brillouin scattering) influence is increased. Nevertheless, however, bleaching of the gain occurs in the last-stage optical fiber amplifier 25. Hence, as shown by a solid line of waveform 29A in FIG. 7C, the pulsewidth of the laser beam LB3 output from the optical amplifier unit 18 is reduced shorter than that of a waveform 29B that is shown by a dotted line and that corresponds as is to the laser beam LB2. Thereby, the adverse effect of the pulsewidth expanded in the optical modulating device 12 is reduced; and consequently, the wavelengths-in-width of ultraviolet lights to be finally output overall can be narrowed.

In the above-described embodiment, the laser light source having an oscillation wavelength of about 1.544 μm is used for the single wavelength oscillatory laser 11. Instead of this laser light source, however, the embodiment may use a laser light source having an oscillation wavelength in a range of from 1.099 to 1.106 μm. For this laser light source, either a DFB semiconductor laser or an ytterbium(Yb)-doped fiber laser may be used. In this case, for the optical fiber amplifier in the rear-stage optical amplification section, the configuration may use an ytterbium(Yb)-doped fiber (YDFA) that performs amplification in a wavelength zone of 990 to 1200 nm including the wavelength of the amplifier section. In this case, ultraviolet light having a wavelength of 157 to 158 nm wave that is substantially the same wavelength of the $F_2$ laser can be obtained by outputting the seventh-order harmonic wave in the wavelength conversion section 20 shown in FIG. 1B. In practice, ultraviolet light having substantially the same wavelength as that of the $F_2$ laser can be obtained by controlling the oscillation wavelength to be about 1.1 μm.

Moreover, the arrangement may be made such that the fourth-order harmonic wave of the fundamental wave is output in the wavelength conversion section 20 by controlling the oscillation wavelength in the single wavelength oscillatory laser 11 to be near 990 nm. This enables ultraviolet light having a same wavelength of 248 nm as that of the KrF excimer laser to be obtained.

In the last-stage high-peak-output optical fiber amplifier (for example, the optical fiber amplifier 25 in the optical amplifier unit 18 shown in FIG. 2), according to above-described present embodiment, it is preferable to use a large mode diameter fiber having a fiber mode diameter of, for example, 20 to 30 μm, which is larger than that is ordinarily used (5 to 6 μm), to avoid the increase in the spectral width according to the nonlinear effects in the fiber.

Moreover, a double clad fiber having a double clad structure may be used in place of the large mode diameter fiber to obtain a high level output in the last-stage optical fiber amplifier (for example, optical fiber amplifier 25 shown in FIG. 2). In this optical fiber, a core portion is doped with ion that contributes to amplification of laser light, and the amplified laser light propagates through the inside of the core. An excitation-dedicated semiconductor laser is coupled to the first clad that covers the core. The first clad serves in a multimode and has a large cross section. As such, the high-output excitation-dedicated semiconductor laser beam can easily be transmitted therethrough, a multimode-oscillation semiconductor laser can be efficiently coupled, and hence, the excitation-dedicated light source can efficiently be used. A second clad for forming a waveguide of the first clad is formed on the circumference of the first clad.

A quarts fiber or a silicate-based fiber may be used for the optical fiber amplifier of the above-described embodiment. Alternatively, a fluoride-based fiber, such as a ZBLAN fiber, may be used. With the fluoride-based fiber, in comparison to the quartz or silicate-based fiber, a relatively high erbium dope concentration can be obtained, thereby enabling the fiber length necessary for amplification can be reduced. Particularly, the fluoride-based fiber is preferably used for the last-stage optical fiber amplifier (optical fiber amplifier 25 shown in FIG. 2). The reduced fiber length enables mitigation in the wavelength width expansion due to the nonlinear effects during pulsed-beam propagation through the fiber. In addition, the reduced fiber length enables the provision of a narrow-band wavelength width necessary for, for example, the exposure apparatus. The narrow-band light source offers an advantage, particularly, when it is used in an exposure apparatus that has a large number of openings. For example, the light source is advantageous in the design and manufacture of the projection optical system.

In addition, an optical fiber mainly using phosphate glass or oxidized-bismuth based glass ($Bi_2O_3B_2O_3$) may be used, particularly for the last-stage optical fiber amplifier. With the phosphate-glass optical fiber, the core can be doped at a high concentration with a rare-earth based element(s) (such as erbium (Er), or both the erbium (Er) and ytterbium (Yb)). In this case, in comparison to the conventional silicate glass, the fiber length necessary to obtain the same optical amplification factor is about $\frac{1}{100}$ of that with the conventional silica glass. With the oxidized-bismuth based glass optical fiber, in comparison to the conventional silica glass, the amount of doped erbium (Er) can be increased to be 100 or more times of that with the conventional silica glass. In this case, effects similar to those with the phosphate glass can be obtained.

In a case where a wavelength of 1.51 to 1.59 $\mu$m is used for the output wavelength of the optical fiber amplifier having the double-structure clads, the fiber core is co-doped with erbium (Er) and ytterbium (Yb) used together as an ion dopant. The co-doping is advantageous to improve the semiconductor-laser excitation efficiency. That is, when the erbium/ytterbium co-doping is performed, high-ytterbium-absorbing wavelength expands near a region of 915 to 975 nm. By using the wavelength near to aforementioned region, the plurality of semiconductor lasers each having a unique oscillation wavelength are connected through wavelength division multiplexing (WDM) and coupled to the first clad. As a result, the plurality of semiconductor lasers can be used as excitation beams, and a high excitation intensity can therefore be implemented.

In designing the doped fiber used In the optical fiber amplifier, a material is preferably selected to obtain a high gain of the optical fiber amplifier in a desired wavelength for an apparatus (such as an exposure apparatus) as in the present example that operates at a predetermined wavelength. For example, a material enabling a high gain to be obtained with desired wavelength, for example 1.548 $\mu$m, is preferably selected for an amplifying fiber used in an ultraviolet laser apparatus designed to obtain the same output wavelength (193 to 194 nm) as that of the ArF excimer laser.

However, for wavelength-division-multiplexed communication, a communication fiber is designed to have a relatively stable gain in a wavelength region of several tenth of nm near 1.55 $\mu$m. As such, for a communication fiber including, for example, erbium-monodoped core as an excitation medium, a method of co-doping a silica fiber with aluminum, phosphorous, and the like is used to implement the stable gain. As such, with the fiber of this type, the gain is not always increased at 1.548 $\mu$m. Aluminum as a dopant element has the effect of shifting the peak near 1.55 $\mu$m, and phosphorous has the effect of shifting the peak to a short wavelength side. As such, a small amount of phosphorous can be used as a dopant to increase the gain in a region near 1.547 $\mu$m. Similarly, a small amount of phosphorous can be used as a dopant to increase the gain in a region near 1.547 $\mu$m to be even higher when using the optical amplifying fiber (such as the double-clad type fiber) having the core doped (codoped) with both erbium and ytterbium.

Hereinbelow, a description will be made regarding example configurations of the wavelength conversion section 20 used in the ultraviolet light generator of the embodiment shown in FIGS. 1A and 1B.

Figure 8A:
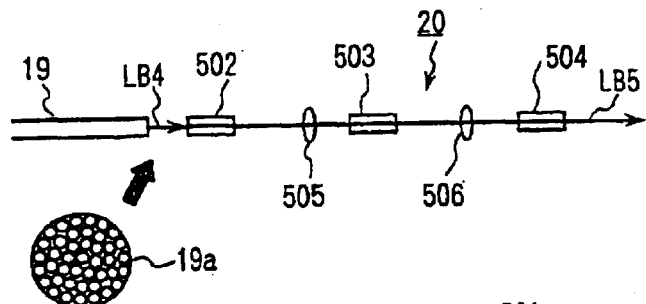
FIG. 8A is a diagram showing a first configuration example of a wavelength conversion section 20 shown in FIGS. 1A and 1B.

FIG. 8A shows the wavelength conversion section 20 that is capable of obtaining the eighth-order harmonic wave through repetition of the second-order harmonic wave generation. In FIG. 8A, the fundamental wave of the laser beam LB4 having a wavelength of 1.544 $\mu$m (the frequency is represented by "$\omega$") output from an output terminal 19a of an optical fiber bundle 19 is incident on a first-stage nonlinear optical crystal 502. The second-order harmonic wave generation is performed therein to generate the second-order harmonic wave having a twofold frequency 2 $\omega$ (wavelength: $\frac{1}{2}$ of 772 nm) of the frequency $\omega$. The generated second-order harmonic wave is then incident on a second-stage nonlinear optical crystal 503 through a lens 505. Similar to the above, through the second-order harmonic wave generation, there is generated fourth-order harmonic wave having a twofold frequency of the frequency 2 $\omega$ of the incident wave, that is, a fourfold frequency 4 $\omega$ (wavelength: $\frac{1}{4}$ of 386 nm) with respect to the fundamental wave. The generated fourth-order harmonic wave is then transferred to a third-stage nonlinear optical crystal 504 through a lens 506. Similarly, through the second-order harmonic wave generation, there is generated eighth-order harmonic wave having a twofold frequency of the frequency 4 $\omega$ of the incident wave, that is, an eightfold frequency 8 $\omega$ (wavelength: $\frac{1}{8}$ of 193 nm) with respect to the fundamental wave. The eighth-order harmonic wave is output as laser beam LB5. Thus, the example configuration performs wavelength modulations in the following order: fundamental wave (wavelength; 1.544 $\mu$m)→second-order harmonic wave (wavelength: 772 nm)→fourth-order harmonic wave (wavelength: 386 nm) eighth-order harmonic wave (wavelength: 193 nm).

Nonlinear optical crystals usable for the above-described wavelength conversion include a $LiB_3O_5$ (LBO) crystal for the nonlinear optical crystal 502 used to convert the fundamental wave into the second-order harmonic wave, a $LiB_3O_5$ (LBO) crystal for the nonlinear optical crystal 503 used to convert the second-order harmonic wave into the fourth-order harmonic wave, and a $Sr_2Be_2B_2O_7$ (SBBO) crystal for the nonlinear optical crystal 504 used to convert the fourth-order harmonic wave into the eight-order harmonic wave. In the present example, a matching method called "non-critical phase matching" (NCPM) is employed for the LBO-crystal used conversion of the fundamental wave into the second-order harmonic wave. The NCPM method regulates the temperature of the LBO crystal for phase matching for the wavelength conversion. The NCPM method does not cause an angular displacement (so-called "walk-off") between the fundamental wave and the second-order harmonic wave in the nonlinear optical crystal, thereby allowing conversion into the second-order harmonic wave with high efficiency. As such, the NCPM method is advantageous in that the generated second-order harmonic wave is not influenced by walk-off-caused beam deformation.

Referring to FIG. 8A, a converging lens, which is effective for improving the incidence efficiency of laser beam LB4, is preferably provided between the fiber bundle 19 and the nonlinear optical crystal 502. In this case, each of the optical fibers constituting the fiber bundle 19 has a mode diameter (core diameter) of about 20 $\mu$m, and a region where the conversion efficiency in the nonlinear optical crystal has a size of about 200 $\mu$m. As such, a lens with a very low magnification of about 10× magnification may be provided in units of the optical fiber to converge the laser beam output from each of the optical fibers into the nonlinear optical crystal 502. This applies also to other example configurations described below.

Figure 8B:
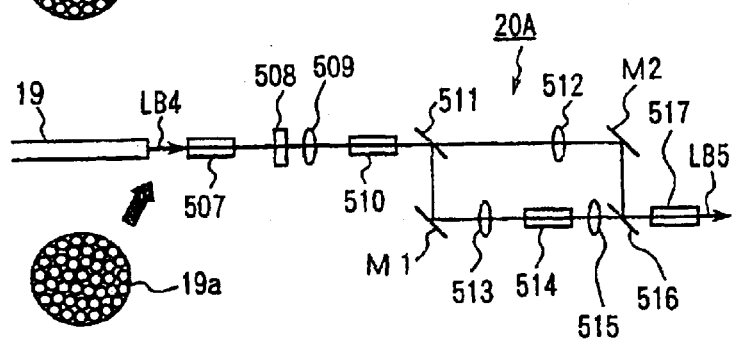
FIG. 8B is a diagram showing a second configuration example of the wavelength conversion section 20.

FIG. 8B shows a wavelength conversion section 20A that is capable of obtaining the eighth-order harmonic wave by combining the second-order harmonic wave generation and sum frequency generation. Referring to FIG. 8B, the fundamental wave of the laser beam LB4 having a wavelength of 1.544 μm output from the output terminal 19a of the fiber bundle 19 is incident on a first-stage nonlinear optical crystal 507 formed of the LBO crystal and controlled by the NCPM method. In the crystal 507, there is generated the second-order harmonic wave (wavelength: 722 nm) according to the second-order harmonic wave generation. In addition, a part of the fundamental wave is transmitted as is through the nonlinear optical crystal 507. Both the fundamental wave and second-order harmonic wave in a linearly polarized state are transmitted trough a wavelength plate 508 (for example, a ½ wavelength plate), and only the fundamental wave is output in a 90-degree rotated direction of polarization. The fundamental wave and the second-order harmonic wave individually pass through a lens 509 and are incident on a second-stage nonlinear optical crystal 510.

In the nonlinear optical crystal 510, there is generated the third-order harmonic wave (wavelength: 515 nm) from the second-order harmonic wave generated in the first-stage nonlinear optical crystal 507 and the fundamental wave transmitted without being converted. The above generation is performed according to the aforementioned sum frequency generation. While the LBO crystal is used for the nonlinear optical crystal 510, it is used in NCPM with a temperature different from that of the first-stage nonlinear optical crystal 507 (LBO crystal). The third-order harmonic wave generated in the nonlinear optical crystal 510 and the second-order harmonic wave transmitted without being converted are isolated by a dichroic mirror 511. Then, the third-order harmonic wave reflected by the dichroic mirror 511 is transmitted through a lens 513 to be incident on a third-stage nonlinear optical crystal 514 formed of a β-BaB$_2$O$_4$ crystal (BBO crystal). Therein, the third-order harmonic wave is converted by the second-order harmonic wave generation into the sixth-order harmonic wave (wavelength: 257 nm).

The second-order harmonic wave transmitted through the dichroic mirror 511 is incident on a dichroic mirror 516 via a lens 512 and a mirror M2. In addition, the sixth-order harmonic wave obtained through the nonlinear optical crystal 514 is incident on the dichroic mirror 516 via a lens 515. In this step, the second-order harmonic wave and the sixth-order harmonic wave are coaxially combined, and a composition thereof is incident on a fourth-stage nonlinear optical crystal 517 formed of the BBO crystal. In the nonlinear optical crystal 517, there is generated the eighth-order harmonic wave (wavelength: 193 nm). The eighth-order harmonic wave is output as an ultraviolet laser beam LB5. A CsLiB$_6$O$_{10}$ (CLBO) crystal may be used in place of the BBO crystal for the nonlinear optical crystal 517. Thus, the wavelength conversion section 20A performs wavelength conversion in the following order: fundamental wave (wavelength: 1.544 μm)→second-order harmonic wave (wavelength: 772 nm)→third-order harmonic wave (wavelength: 515 nm)→sixth-order harmonic wave (wavelength: 257 nm)→eighth-order harmonic wave (wavelength: 193 nm).

As described above, the present example has the configuration in which one of the sixth-order harmonic wave and second-order harmonic wave passes through a split optical path and is then incident on the fourth-stage nonlinear optical crystal 517. In the configuration, the lenses 515 and 512 individually converging the sixth-order harmonic wave and the second-order harmonic wave into the fourth-stage nonlinear optical crystal 517 can be disposed on optical paths different from each other. In this case, the sixth-order harmonic wave generated in the third-stage nonlinear optical crystal 514 is shaped by the walk-off phenomenon to have an elliptical cross section. As such, beam-shaping is preferably performed for the sixth-order harmonic wave to obtain a high conversion efficiency with the fourth-stage nonlinear optical crystal 517. To implement the above, as in the present example, by disposing the individual lenses 515 and 512 on different optical paths, for example, a cylindrical lens pair can be used for the converging lens 515, thereby enabling the beam-shaping for the sixth-order harmonic wave to easily be implemented. Hence, the conversion efficiency can be improved by increasing overlapping portions with the second-order harmonic wave in the fourth-stage nonlinear optical crystal 517 (BBO crystal).

The configuration between the second-stage nonlinear optical crystal 510 and the fourth-stage nonlinear optical crystal 517 is not limited to that shown in FIG. 8B. This configuration may be arbitrarily arranged as long as it has the same optical path lengths for the sixth-order harmonic wave and the second-order harmonic wave to cause the sixth-order harmonic wave and the second-order harmonic wave to be incident on the fourth-stage nonlinear optical crystal 517. Moreover, for example, the third-stage and fourth-stage nonlinear optical crystals 514 and 517 may be disposed on the same optical axis of the second-stage nonlinear optical crystal 510. In this configuration, the third-stage nonlinear optical crystal 514 is used to convert only the third-order harmonic wave into the sixth-order harmonic wave according to the second-order harmonic wave generation, and the converted harmonic wave and the non-converted second-order harmonic wave together may be incident on the fourth-stage nonlinear optical crystal 517. This configuration avoids the necessity of using the dichroic mirrors 511 and 516.

For the individual wavelength conversion sections 20 and 20A shown in FIGS. 8A and 8B, the average output power of the per-channel eighth-order harmonic waves (wavelength: 193 nm) were experimentally obtained. As described in the above-described embodiment, the output of the fundamental wave at each of the channel output terminal is characterized by a peak power of 20 kW, a pulsewidth of 1 ns, a pulse repetition frequency of 100 kHz, and an average output power of 2W. As a result, the per-channel average output powers of the eighth-order harmonic waves were 229 mW in the wavelength conversion section 20 shown in FIG. 8A, and 38.3 mW in the wavelength conversion section 20A shown in FIG. 8B. Accordingly, the average output powers from the bundle of all the 128 channels are 29 W in the wavelength conversion section 20, and 4.9 W in the wavelength conversion section 20A. As such, in either of the wavelength conversion sections 20 and 20A, ultraviolet light having a wavelength of 193 nm beam, which is sufficient as an exposure-apparatus-dedicated light source can be provided.

A configuration similar to the wavelength conversion section 20,20A can be arranged to perform the wavelength conversion in the following order: fundamental wave (wavelength: 1.544 μm)→second-order harmonic wave (wavelength: 772 nm)→fourth-order harmonic wave (wavelength: 386 nm)→sixth-order harmonic wave (wavelength: 257 nm)→eighth-order harmonic wave (wavelength: 193 nm). Moreover, a configuration can be arranged to perform the wavelength conversion in the following order: fundamental wave (wavelength: 1.544 μm)→second-order harmonic wave (wavelength: 772 nm)→third-order harmonic wave (wavelength: 515 nm)→fourth-order harmonic wave (wavelength: 386 nm)→seventh-order (wavelength: 221 nm)→eighth-order harmonic wave (wavelength: 193 nm). Furthermore, the eighth-order harmonic wave can be obtained through the wavelength conversion performed in the following order: fundamental wave (wavelength: 1.544 µm)→second-order harmonic wave (wavelength: 772 nm)→third-order harmonic wave (wavelength: 515 nm)→fourth-order harmonic wave (wavelength: 386 nm)→sixth-order harmonic wave (wavelength: 257 nm)→seventh-order harmonic wave (wavelength: 221 nm)→eighth-order harmonic wave (wavelength: 193 nm). It is preferable to select one of the above configurations that has a relatively high conversion efficiency and that can be simplified.

Hereinbelow, a description will be made regarding an example configuration of a wavelength modulator section that enables ultraviolet light having substantially the same wavelength as that of the $F_2$ laser (wavelength: 157 nm). To implement the above, as the wavelength conversion section 20, the configuration may be arranged to use a wavelength conversion section capable of generating the tenth-order harmonic wave with 1.57 µm wavelength of the fundamental wave generated in the single wavelength oscillatory laser 11 shown in FIG. 1A.

Figure 9A:
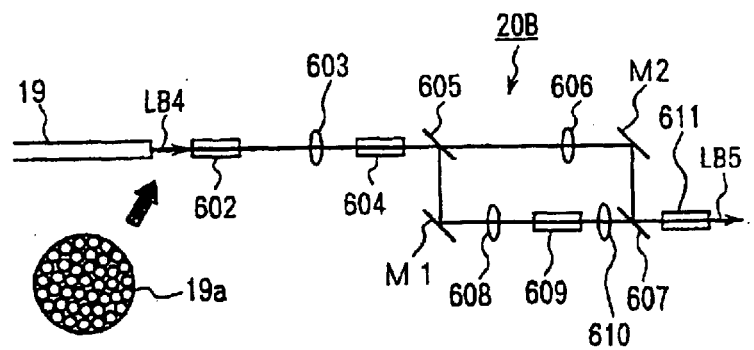
FIG. 9A is a diagram showing a third configuration example of a wavelength conversion section 20.
Figure 9B:
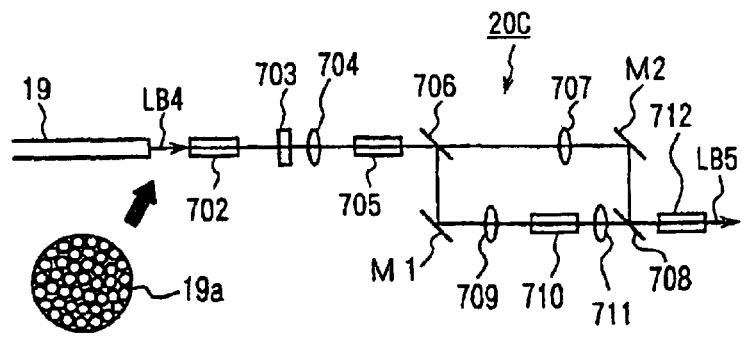
FIG. 9B is a diagram showing a fourth configuration example of the wavelength conversion section 20.

FIG. 9A shows a wavelength conversion section 20B that enables the tenth-order harmonic wave to be generated through combination of the second-order harmonic wave generation and the sum frequency generation. Referring to FIG. 9B, the fundamental wave of the laser beam LB4, having a wavelength of 1.57 µm, which has been output from the output terminal 19a of the fiber bundle 19, is incident on a first-stage nonlinear optical crystal 602 formed of the LBO crystal, and is converted into the second-order harmonic wave according to the second-order harmonic wave generation. The second-order harmonic wave is then incident on a second-stage nonlinear optical crystal 604 formed of LBO via a lens 603, and is converted into the fourth-order harmonic wave according to the second-order harmonic wave generation; and a part of the second-order harmonic wave is transmitted therethrough without being converted.

Both the second-order harmonic wave and fourth-order harmonic wave transmitted through the second-stage nonlinear optical crystal 604 are directed to a dichroic mirror 605. The fourth-order harmonic wave reflected is reflected by a mirror MI, passes through a lens 608, and is incident on a third-stage nonlinear optical crystal 609 formed of the $Sr_2Be_2B_2O_7$ (SBBO) crystal, and is converted thereby into the eighth-order harmonic wave according to the second-order harmonic wave generation. On the other hand, the second-order harmonic wave transmitted through the dichroic mirror 605 is incident on a dichroic mirror 607 through a lens 606 and a mirror M2. The eighth-order harmonic wave obtained through the third-stage nonlinear optical crystal 609 is also incident on the dichroic mirror 607 via a lens 610. Then, the second-order harmonic wave and the eighth-order harmonic wave are coaxially combined, and the combined harmonic waves are incident on a fourth-stage nonlinear optical crystal 611 formed of the SBBO crystal. Therein, the tenth-order harmonic wave (wavelength: 157 µm) can be generated from the eighth-order harmonic wave and the second-order harmonic wave according to the sum frequency generation. The tenth-order harmonic wave is output as an ultraviolet laser beam LB5. Thus, the wavelength conversion section 20B performs wavelength conversion in the following order: fundamental wave (wavelength: 1.57 µm)→second-order harmonic wave (wavelength: 785 nm)→fourth-order harmonic wave (wavelength: 392.5 nm)→eighth-order harmonic wave (wavelength: 196.25 nm)→tenth-order harmonic wave (wavelength: 157 nm).

Also in the example configuration, the arrangement may be made such that the dichroic mirrors 605 and 607 are not used, and the four nonlinear optical crystals 602, 604, 609, and 611 are disposed on the same optical axis. However, the fourth-order harmonic wave generated in the second-stage nonlinear optical crystal 604 is formed to have an elliptical cross section because of the walk-off phenomenon. As such, to obtain a high conversion efficiency in the fourth-stage nonlinear optical crystal 611 that inputs the aforementioned harmonic wave beam, the beam shape of the fourth-order harmonic wave to be used as the incidence beam is preferably reshaped to thereby enlarge portions overlapping with the second-order harmonic wave. In the present example, the converging lenses 606 and 608 can discretely be disposed on the different optical axes. As such, for example, using a cylindrical lens for the lens 608, the beam-shaping of the fourth-order harmonic wave can easily be implemented. This enables the conversion efficiency to be improved.

In addition, a different method may be employed to obtain ultraviolet light having substantially the same wavelength as the wavelength (157 nm) of the $F_2$ laser. A method can be envisaged that uses a wavelength conversion section as the wavelength conversion section 20, which is capable of generating the seventh-order harmonic wave with the 1.099-µm wavelength of the fundamental wave generated in the single wavelength oscillatory laser 11.

FIG. 9B shows a wavelength conversion section 20C that enables the seventh-order harmonic wave to be generated through combination of the second-order harmonic wave generation and the sum frequency generation. Referring to FIG. 9B, the laser beam LB4 (fundamental wave), having a wavelength of 1.099 µm, which has been output from the output terminal 19a of the fiber bundle 19, is incident on a first-stage nonlinear optical crystal 702 formed of the LBO crystal, and the second-order harmonic wave is generated therein according to the second-order harmonic wave generation. A part of the fundamental wave is transmitted as is therethrough. Both the fundamental wave and second-order harmonic wave transmits in a linearly polarized state transmits through a wavelength plate 703 (such as a ½ wavelength plate), and only the direction of polarization of only the fundamental wave is rotated through 90 degrees. The fundamental wave and the second-order harmonic wave is led through a lens 704 to be incident on a second nonlinear optical crystal 705 formed of the LBO crystal. The third-order harmonic wave is generated therein according to the sum frequency generation, and a part of the second-order harmonic wave is transmitted as is therethrough.

The second-order harmonic wave generated from the second nonlinear optical crystal 705 and the third-order harmonic wave are split by a dichroic mirror 706. The third-order harmonic wave transmitted therethrough is incident on a dichroic mirror 708 via a lens 707 and a mirror M2. On the other hand, the second-order harmonic wave reflected by the dichroic mirror 706 passes through a mirror Ml and a lens 709, is incident on a third nonlinear optical crystal 710, and is converted therein into the fourth-order harmonic wave. The fourth-order harmonic wave is led through a lens 711 to be incident on the dichroic mirror 708. The third-order harmonic wave and fourth-order harmonic wave coaxially combined by the dichroic mirror 708 are incident on a fourth nonlinear optical crystal 712 formed of the SBBO crystal, and are therein converted into the seventh-order harmonic wave (wavelength: 157 nm) according to the sum frequency generation. The seventh-order harmonic wave is output as an ultraviolet laser beam LB5.

Thus, the present example configuration performs wavelength conversion in the following order: fundamental wave (wavelength: 1.099 µm)→second-order harmonic wave (wavelength: 549.5 nm)→third-order harmonic wave (wavelength: 366.3 nm)→fourth-order harmonic wave (wavelength: 274.8 nm)→seventh-order harmonic wave (wavelength: 157 nm).

Also in the example configuration, the arrangement may be made such that the dichroic mirrors 706 and 708 are not used, and the four nonlinear optical crystals 702, 705, 710, and 712 are disposed on the same optical axis. Also in the present example, the fourth-order harmonic wave generated in the third-stage nonlinear optical crystal 710 is formed to have an elliptical cross section because of the walk-off phenomenon. As such, to obtain a high conversion efficiency in the fourth-stage nonlinear optical crystal 712 that inputs the aforementioned harmonic wave beam, a cylindrical lens may preferably be used for the lens 711 to thereby maximize the portion where the third-order harmonic wave and the fourth-order harmonic wave overlap.

As is apparent from FIG. 1A, in the above-described embodiment, the combined light of the outputs of the n optical amplifier units 18-1 to 18-n in the m-group is converted in wavelength by using the single wavelength conversion section 20. Alternatively, however, the configuration may be arranged such that, for example, m' units (m'="2" or larger inger) wavelength conversion sections are provided. In the alternative configuration, the outputs of the m-group optical amplifier units 18-1 to 18-n are divided in units of n' outputs into m' groups, the wavelength conversion is performed for one of the wavelength conversion section in units of one of the groups, and the obtained m' ultraviolet light beams (in the present example, m'="4", "5", or the like) are combined. Thus, the wavelength conversion section 20 is not limited to that having the above-described configuration. Moreover, for example, a CBO crystal ($CsB_3O_5$), a lithium tetraborate $Li_2B_4O_7$ (LBO), a KAB ($K_2Al_2B_4O_7$), or a GdYCOB ($Gd_xY_{1-x}Ca_4O(BO_3)_3$), may be used as an alternative crystal for the nonlinear optical crystal.

According to the ultraviolet light generator of the above-described embodiment, the diameter of the output terminal of the fiber bundle 19, shown in FIG. 1A, even with all the channels being included, is about 2 mm or smaller. As such, one or several units of the wavelength conversion sections 20 are sufficient to perform the wavelength conversion of all the channels. In addition, since flexible optical fibers are used for the output terminals, the flexibility in configuration is very high. For example, the configuration sections such as the wavelength conversion section, the single wavelength oscillatory laser, and the splitter, can be separately disposed. Consequently, the ultraviolet light generator of the present example enables the provision of an ultraviolet laser device that is inexpensive and compact, and has a low spatial coherence while it is of a single wavelength type.

Figure 10:
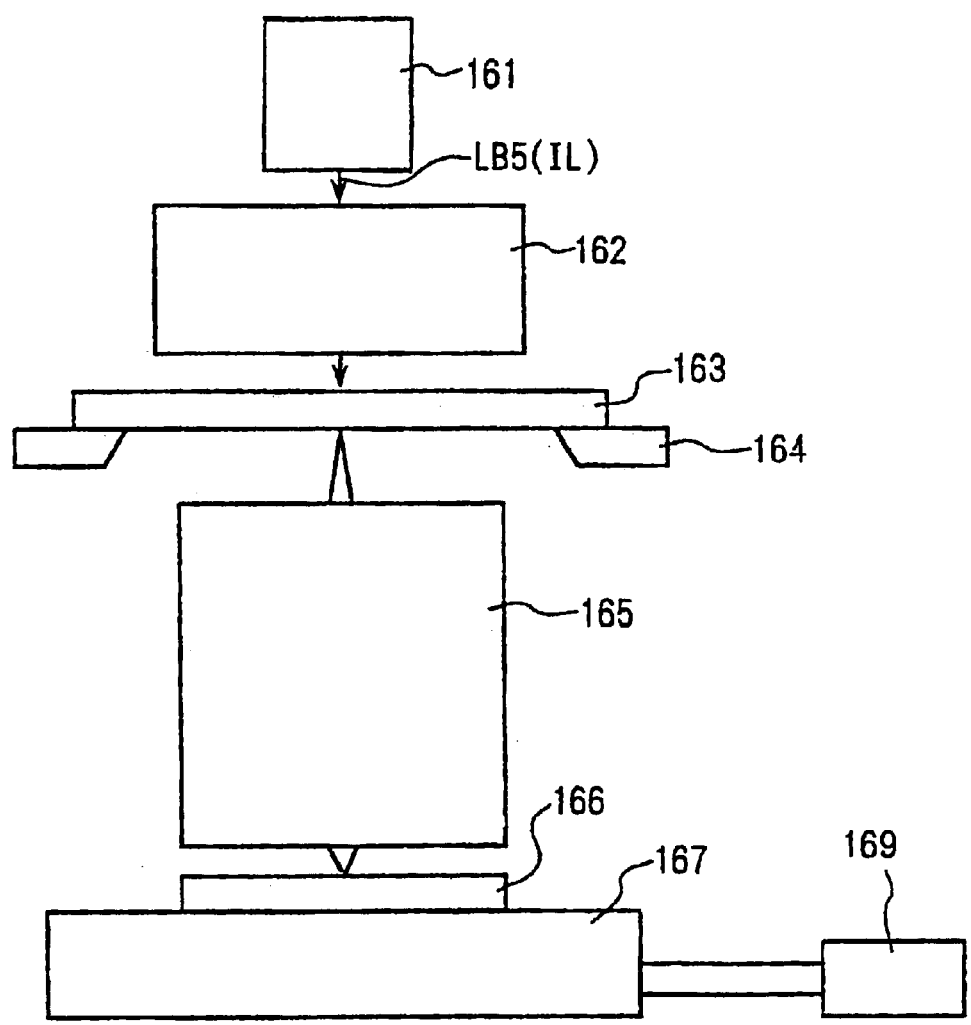
FIG. 10 is a configuration view showing an example of an exposure apparatus employing an ultraviolet light generator of the embodiment.

Hereinbelow, an example exposure apparatus using the ultraviolet light generator shown in FIG. 1A will be described. FIG. 10 shows the exposure apparatus of the present example. Referring to FIG. 10, devices usable for an exposure light source 161 include, for example, a device with an ultraviolet region of 193 nm, 157 nm, or the like based on the wavelength of a laser beam that is output from the ultraviolet light generator shown in FIG. 1A. A laser beam LBS that has been output from the exposure light source 161 is incident as exposure light IL on an illumination system 162. The illumination system 162 is configured of, for example, an optical integrator (homogenizer) for homogenizing illuminance distributions of the exposure light IL, an aperture diaphragm, a field diaphragm (reticle blind), and a condenser lens. In the aforementioned configuration, the exposure light IL output from the illumination system 162 illuminates a slit-like illumination region of a pattern surface of a reticle 163 set as a mask to provide a homogeneous illuminance distribution. In the present example, since the spatial coherence of the exposure light IL is so low that the configuration of a member for reducing the spatial coherence in the illumination system 162 can be simplified, and the exposure apparatus can therefore be further miniaturized.

The reticle 163 is set on a reticle stage 164. The exposure light IL transmitted through the reticle 163 is used to project a demagnified image of a pattern in the illumination region onto a wafer 166 (exposure-target substrate) via a projection optical system 165. The projection is performed at a magnification $M_{RW}$ (for example, ¼, ⅕, ⅙, or the like). For the projection optical system 165, any one of a dioptric system, a reflection system, or a catadioptric system is usable. However, when using vacuum ultraviolet light for the exposure light IL, since materials having high transmittance is limited, the catadioptric system may preferably used to improve the imagingperformance. The wafer 166 is coated with photoresist, and is a disc-like substrate, such as a semiconductor (silicon or the like) or a SOI (silicon on insulator).

The wafer 166 is held on a wafer stage 167, and the three-dimensional position of the wafer 166 is defined by the wafer stage 167 driven by a drive section 169. At the time of exposure, the wafer 166 is positioned through stepping movements of the wafer stage 167. Thereafter, the reticle 163 is scanned via the reticle stage 164 in a predetermined direction with respect to the illumination region, and the image of the pattern of the reticle 163 is transferred on each shot region of the wafer 166 according to step-and-scan method. In this case, the step-and-scan method performs scanning the wafer 166 via the wafer stage 167 by using the magnification $M_{RW}$ as a velocity ratio. Thus, the exposure apparatus of the present example is of a scan-exposure type. However, it should be apparent that the exposure light source 161 can be applied also to a exposure apparatus, such as a stepper, of a full-field-exposure type.

In the above-described case, since the exposure light source 161 of the present example is small, it may be immobilized together with at least a portion (such as the wavelength conversion section 20) of the exposure light source 161 on a frame provided for supporting the illumination system 162. Alternatively, the exposure light source 161 may be independently disposed. However, a power supply and the like to be coupled to the exposure light source 161 are preferably disposed separately.

As described above, the exposure apparatus using the ultraviolet light generator of the present example is smaller in comparison with the conventional one using another type (exposure apparatus using, for example, the excimer laser or the arrayed laser). In addition, since the exposure apparatus is configured of elements coupled using the optical fibers, the exposure apparatus has a high flexibility in disposition of the individual units used for the configuration thereof.

Exposure-light-amount control in the above-described scan-exposure operation may be implemented in the following manner. Control is performed for at least one of the pulse repetition frequency f, which is defined by the optical modulating device 12 shown in FIG. 1A, and the interchannel delay time, which is defined by the delaying devices (optical fibers 15-1 to 15-m, and 17-1 to 17-n). The control is thus performed to cause a fundamental-wave generator section 171 to oscillate a plurality of pulsed beams at equal time intervals during scan-exposure operation. In addition, according to the sensitivity property of the photoresist, at least one of the optical intensity of the pulsed beam on the wafer 166, the scan speed for the wafer 166, the pulsed-beam oscillation interval (frequency), and the width of the pulsed beam in the scan direction for the wafer 166 (that is, an radiation region thereof to thereby control the integrated luminous quantity of a plurality of pulsed beams irradiated in a period in which the individual points of the wafer traverse the radiation region. At this time, in consideration of the throughput, least one of other control parameters representing the pulsed-beam optical intensity, the oscillation frequency, and the radiation region width is preferably controlled so that the scan speed for the wafer 166 is substantially maintained to be the maximum speed of the wafer stage 167.

Figure 11:
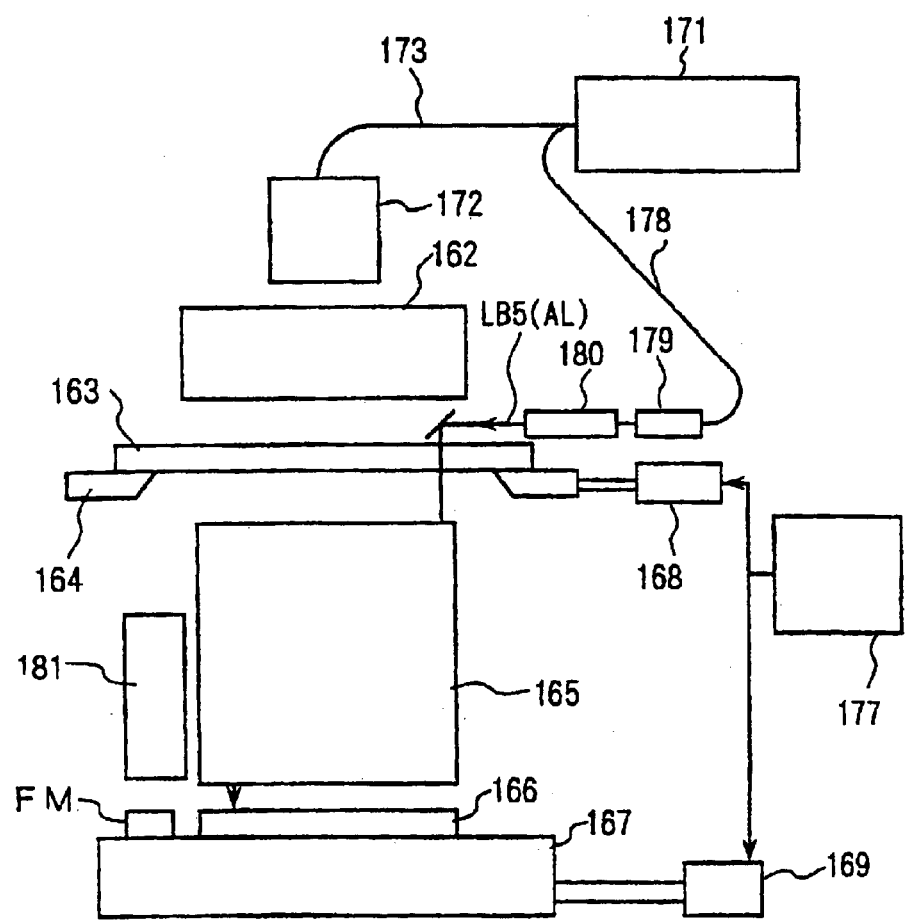
FIG. 11 is a configuration view showing another example of a n exposure apparatus employing an ultraviolet light generator of the embodiment.

FIG. 11 shows another exposure apparatus using the ultraviolet light generator of the present example. Referring to FIG. 11, the ultraviolet light generator shown in FIG. 1A is attached apart. Specifically, referring to FIG. 11 showing the portions corresponding to those shown in FIG. 10 by assigning the same reference symbols, a wavelength conversion section 172 corresponding to the wavelength conversion section 20 shown in FIG. 1A is mounted on the exposure apparatus mainbody. On the other hand, a light-source mainbody section 171 corresponding to the members of from the single wavelength oscillatory laser 11 to optical splitting amplifier section 4 shown in FIG. 1A are provided outside of the exposure apparatus mainbody, and a coupling-dedicated optical fiber 173 is used to couple therebetween. The coupling-dedicated optical fiber 173 corresponds to the fiber bundle 19 shown in FIG. 1A.

The configuration built as described above enables major configuration portions involving heat generation to be disposed outside of the exposure apparatus mainbody. The major configuration portions include an excitation-dedicated semiconductor laser for the optical fiber amplifier, a driving power supply for the semiconductor laser, and a temperature controller. As such, the configuration enables the mitigation or avoidance of heat-attributed problems, such as a problem of optical-axis misalignment that can occur when the exposure apparatus mainbody is influenced by heat generated in the ultraviolet light generator provided as the exposure light source.

As shown in FIG. 11, the reticle stage 164, which is provided for holding the reticle 163, is configured so that it is driven by the driving mechanism 168 to be movable in the X and Y directions and to be finely rotatable. In addition, a primary control system 177 controls operation of a driving section 169 provided to drive the wafer stage 167 and operation of the driving mechanism 168 for the reticle stage 164.

A reference mark plate FM is provided on the wafer stage 167. The reference mark plate FM is used for, for example baseline measurement described below. Moreover, the present example includes an alignment system 180 provided for detecting an alignment mark on the reticle 163, and an alignment system 181 of an off-access method that operates without the projection optical system 165.

The alignment system 180 radiates exposure light or illumination light having the same wavelength thereof onto the alignment mark and onto a reference mark (alignment mark on the wafer 166) on the reference mark plate FM through the projection optical system 165. In addition, the alignment system 180 uses an image-capturing device (CCD) to receive light generated from the aforementioned two marks, and is used for, for example, alignment of the reticle 163 and baseline measurement of the alignment system 181.

The off-access alignment system 181 radiates white light (broad band light) having a wavelength width of about 550 to 750 nm onto the alignment mark on the wafer 166. In addition, the alignment system 181 causes an image of an index mark and an image of the alignment mark to be imaged on the Image-capturing device (CCD), and detects positional displacements of the two marks.

When the alignment systems 180 and 181 are used to individually detect the reference mark on the reference mark plate FM, the amount of the baseline (gap between the detection center and the exposure center) can be measured from the detection results. The baseline measurement is performed prior to the start of exposure of the wafer. However, the baseline measurement may be performed each time the wafer is replaced; or alternatively, the measurement may be performed at a ratio of about one time with respect to the exposure operation for a plurality of wafers. However, the baseline is inevitably measured after the reticle has been replaced.

In the present example, a laser beam from the light-source mainbody section 171 is fed to a wavelength conversion section 179 via an optical fiber 178. For the wavelength conversion section 179, the present example uses a wavelength conversion section that is similar to the wavelength conversion section 20 shown in FIG. 1A and that is relatively small. The wavelength conversion section 179 is integrally provided on the frame that holds the alignment system 180, in which ultraviolet light that has been output from the wavelength conversion section 179 is used as illumination light.

The above-described arrangement avoids the necessity of providing an light source for the alignment system 180. In addition, the reference mark or the alignment mark can be detected by using illumination light having the same wavelength as that of exposure light, and accurate mark detection can be implemented.

The optical fiber (including the optical fiber amplifier and the like) used in the above-described embodiment may preferably be covered with a low-degassing material, such as Teflon or fluorine-based resin. Foreign matters (including fibrous matters and the like) occurred from the optical fiber can be contaminants that contaminates, and the optical fiber is covered as described above to prevent the occurrence of the contaminants. However, instead of covering the optical fiber with the Teflon or the like, the optical fibers disposed in chambers may be collectively stored in a stainless steel housing.

The exposure apparatus of the above-described embodiment shown, for example, in FIG. 11, may include a spatial-image measuring system. The spatial-image measuring system may be such that the mark provided on the reticle 163 and the reference mark provided on the reticle stage 164 are illuminated with illumination light having the same wavelength, and a mark image formed by the projection optical system 165 is detected through an opening (such as a slit) provided on the wafer stage 167. For a light source generating the illumination light for the spatial-image measuring system, a light source (similar to the ultraviolet light generator shown in FIGS. 1A and 1B) having the same configuration as that of the above-described light source (171 and 179) may be separately provided. Alternatively, the exposure-dedicated light source formed of the members including the light-source mainbody section 171 and the illumination system 162 may be shared.

In the above-described embodiment, description has been made that the laser device shown in FIGS. 1A and 1B is used either as the exposure-dedicated light source or as the light source of the alignment system or the spatial-image measuring system. However, the laser device may be used as a regulating light source of a detecting system or an optical system for marks other than the above. In addition, the laser device may be used not only as the light source of the exposure apparatus, the testing apparatus, or the like used in the device-manufacturing step, but also as a light source of various other apparatuses, regardless of the use and like thereof (an example is an apparatus using an excimer laser as a light source, such as a laser medical treatment apparatus for performing medical treatment for, for example, the near site and the astigmatism, by correcting, for example, the curvature or the irregularity of the cornea).

The exposure apparatus of the embodiment can be manufactured in the following manner. The illumination optical system and the projection optical system, which are formed to include the plurality of lenses, are built into the exposure apparatus mainbody, and are optically adjusted. The configuration members such as the reticle stage and the projection optical system, which are formed of many mechanical components, are assembled to the exposure apparatus mainbody; and wirings, pipings, and the like are connected. In addition, the total adjustment (including electrical adjustment and operational verification) is performed. The exposure apparatus is preferably manufactured by a so-called "clean room" for which environmental factors, such as the temperature and the cleanliness are managed.

The semiconductor device is manufactured according to various processing steps. The processing steps including a step of designing functions and performance of the device; a step of manufacturing a reticle according to the aforementioned step; a step of manufacturing a wafer from a silicon material; a step of exposing the wafer to a pattern of the reticle by using the exposure apparatus of the above-described embodiment; a step of device assembly (the step includes a dicing step, a bonding step, and a packaging step); and an inspecting step.

Moreover, the present invention may also be applied to the manufacture of various other devices. The devices include display devices such as a liquid crystal display device and a plasma display device; thin-film magnetic disks; micromachines; and various devices such as DNA chips. Moreover, the present invention may be applied to the manufacture of a photomask for a projection exposure apparatus.

The laser device disclosed herein as the exposure light source of the present invention may also be applied to a laser-repairing unit used to cut a part (such as a fuse) of a circuit pattern formed on a wafer. In addition, the laser device may also be applied to a testing apparatus that uses visible light or infrared light. In this case, the above-described wavelength conversion section need not be built in the laser device. Thus, the present invention is effective for not only the ultraviolet light generator, but laser devices that generate fundamental waves of either a visible region or an infrared region and that do not have a wavelength conversion section.

The present invention regarding the exposure apparatus may be applied to a proximity exposure apparatus that performs exposure for a mask pattern in a state where a mask and a substrate are proximately set without using a projection optical system.

The present invention is not limited to the above-mentioned embodiments, and the invention may, as a matter of course, be embodied in various forms without departing from the gist of the present invention. Furthermore, the entire disclosure of Japanese Patent Application 11-258131 filed on Sep. 10, 1999 including description, claims, drawings and abstract are incorporated herein by reference in its entirety.

Industrial Applicability

According to the present invention, since the optical fiber amplifiers are used, the exposure apparatus including a small laser device as a laser light source having a high maintainability can be provided.

Furthermore, the exposure apparatus of present invention is capable of mitigating wavelength width expansion attributed to nonlinear effects of optical elements used therein.

Still furthermore, the exposure apparatus of the present invention further includes the optical splitter for splitting a laser beam generated by the laser light generation section into a plurality of laser beams, and the optical amplification sections are discretely provided for the plurality of the split laser beams. In addition, the wavelength conversion section collectively performs wavelength conversion in units of a bundle of laser beams output from the plurality of optical amplification sections. Thereby, the oscillation frequency of the output beam can be increased, the spatial coherence can be reduced, and the oscillation spectral linewidths can be narrowed overall with a simplified configuration.

What is claimed is:

1. An exposure apparatus which illuminates a pattern of a first object with ultraviolet light from a laser device and exposes a second object with the ultraviolet light which has passed through the pattern of the first object, wherein
the laser device includes:
a laser light generation section which generates laser light having a single wavelength within a wavelength range ranging from an infrared band to a visible band;
an optical amplification section including plural stages of optical fiber amplifiers which serially amplify the laser light generated by the laser light generation section, and a narrow band filter and an isolator disposed between the plural stages of the optical fiber amplifiers; and
a wavelength conversion section which performs wavelength conversion of the laser light amplified by the optical amplification section into ultraviolet light by using a nonlinear optical crystal.

2. An exposure apparatus as recited in claim 1, wherein the laser device includes an excitation-light generating light source which generating excitation light which is to be used at least one of the plural stages of the optical fiber amplifiers, and the optical amplifier is formed such that a reflection film which reflects the excitation light is formed at one end of the optical fiber coupled to the narrow band filter.

3. An exposure apparatus as recited in claim 1, wherein the narrow band filter and the isolator reduce noise of a wavelength corresponding to a phonon sideband.

4. An exposure apparatus as recited in claim 1, wherein at least three stages of the optical fiber amplifiers are provided, and the narrow band filter and the isolater are respectively provided between the individual optical fiber amplifiers.

5. An exposure apparatus as recited in claim 1, wherein a gate device, which performs timewise removal of ASE (amplified spontaneous emission), is further provided between the plural stages of the optical fiber amplifiers.

6. An exposure apparatus as recited in claim 1, wherein the laser device includes an optical modulation section which modulates the laser light generated by the laser light generation section into pulsed light and which sets the width of the pulsed light to be wider than a pulsewidth set for obtaining a predetermined wavelength width with the ultraviolet light.

7. An exposure apparatus as recited in claim 12, wherein the laser device includes an optical splitter which splits the laser light generated by the laser light generation section into a plurality of laser light beams, the optical amplification section is independently provided for each of the plural split laser light beams, and the laser device further includes a regulator which regulates an amplification gain of the optical amplification sections so that outputs of the plurality of split laser light beams are substantially uniformalized.

8. An apparatus according to claim 6, wherein
the laser light generation section includes a single wavelength oscillation laser which generates the laser light of a single wavelength, and the laser light generation section pulse-generates the laser light by at least one of the single wavelength oscillation laser and the optical modulation section.

9. An exposure apparatus as recited in claim 1, wherein the optical fiber amplification section is an erbium-doped fiber amplifier and uses laser light having a wavelength of (980±10) nm as the excitation light for the amplifier.

10. An exposure apparatus as recited in claim 1, wherein a multilayer film filter or a fiber Bragg grating is used for the narrow band filter.

11. An exposure apparatus as recited in claim 1, wherein the laser light generation section includes a single wavelength oscillatory laser which generates the laser light having a single wavelength within a wavelength range ranging from an infrared band to a visible band, and an oscillation-wavelength controller which controls an oscillation wavelength of the generated laser light to be a predetermined wavelength.

12. An exposure apparatus as recited in claim 1, wherein
the laser device further includes an optical splitter which splits the laser light generated by the laser light generation section into a plurality of laser light beams,
the optical amplification section is independently provided for each of the plural split laser light beams, and
the wavelength conversion section performs collective wavelength conversion of a bundle of the laser light beams output from the plural optical amplification sections.

13. An exposure apparatus as recited in claim 12, further comprising a regulator which regulates an amplification gain of the optical amplification sections so that outputs of the plurality of split laser light beams are substantially uniformalized.

14. An exposure apparatus as recited in claim 12, wherein the regulator changes the output of the excitation light used for the optical fiber amplifier in the optical amplification section.

15. An exposure apparatus as recited in claim 1, wherein
the laser light generation section generates single wavelength laser light having a wavelength of near 1.5 $\mu$m, and
the wavelength conversion section converts a fundamental wave output from the optical amplification section having a wavelength of near 1.5 $\mu$m into ultraviolet light of an eighth-order harmonic wave or a tenth-order harmonic wave and outputs the converted light.

16. An exposure apparatus as recited in claim 1, wherein
the laser light generation section generates a single wavelength laser light having a wavelength of near 1.1 $\mu$m, and
the wavelength conversion section converts a fundamental wave output from the optical amplification section having a wavelength of near 1.1 $\mu$m into ultraviolet light of a seventh-order harmonic wave thereof and outputs the converted light.

17. An exposure apparatus as recited in claim 1, comprising:
an illumination system which radiates ultraviolet light from the laser device onto a mask as the first object; and
a projection optical system which projects an image of a pattern of the mask onto a substrate as the second object.

18. An exposure method using an exposure apparatus as recited in claim 1, comprising using the ultraviolet light output from the laser device to perform alignment between the first object and the second object.

19. A device manufacturing method including transferring a mask pattern onto a substrate by using the exposure apparatus as recited in claims 1.

20. An exposure apparatus which illuminates a pattern of a first object with ultraviolet light from a laser device and exposes a second object with the ultraviolet light which has passed through the pattern of the first object, wherein
the laser device includes:
a laser light generation section which generates laser light of a single wavelength, having a single wavelength within a wavelength range ranging from an infrared band to a visible band;
an optical amplification section including plural stages of amplifying optical fibers which serially amplify the laser light generated by the laser light generation section, an excitation-light generating light source which generates excitation light for at least one stage of the amplifying optical fiber of the plural stages of the amplifying optical fibers, a narrow band filter or an isolator disposed between the plural stages of the amplifying optical fibers, and a bypass member which passes the excitation light in parallel to the narrow band filter or the isolator; and
a wavelength conversion section which performs wavelength conversion of the laser light amplified by the optical amplification section into ultraviolet light by using a nonlinear optical crystal.

21. An apparatus according to claim 20, wherein
the laser ligth generation section pulse-generates the laser light and includes an optical modulation section which sets a pulse-width of the laser light to be wider than a pulse-width set for obtaining a predetermined wavelength width with the ultraviolet light.

22. An apparatus according to claim 20, wherein
the plural stages of the amplifying optical fibers include erbium-doped optical fiber amplifiers and use laser light having a wavelength of about 980±10 nm as the excitation light for the amplifiers.

23. An exposure apparatus which illuminates a pattern of a first object with ultraviolet light from a laser device and exposes a second object with the ultraviolet light which has passed through the pattern of the first object, wherein the laser device includes:
a laser light generation section which generates laser light having a single wavelength within a wavelength range ranging from an infrared band to a visible band;
an optical amplification section including plural stages of optical fiber amplifiers which serially amplify the laser light generated by the laser light generation section, a plurality of excitation-light generating light sources which individually generate excitation lights for each of the plural stages of the optical fiber amplifiers, and a narrow band filter disposed beween the plural stagesof the optical fiber anplifiers, wherein a reflection film which reflects the excitation light is formed at one end of each of the optical fibers coupled to both sides of the narrow band filter; and
a wavelength conversion section which performs wavelength conversion of the laser light amplified by the optical amplification section into ultraviolet light by using a nonlinear optical crystal.

24. An apparatus according to claim 23, wherein
the laser light generation section pulse-generates the light and includes an optical modulation section which sets a pulse-width of the laser light to be wider than a pulse-width set for obtaining a predetermined wavelength width with the ultraviolet light.

25. An apparatus according to claim 23, wherein
the plural stages of the amplifying optical fibers include erbium-doped optical fiber amplifiers and use laser light having a wavelength of about 980±10 nm as the excitation light for the amplifiers.

26. An exposure apparatus which illuminates a pattern of a first object with ultraviolet light from a laser device and exposes a second object with the ultraviolet light which has passed through the pattern of the first object, wherein
the laser device includes:
a laser light generation section which includes a single wavelength oscillatory laser and an optical modulation section and which pulse-generates laser light having a single wavelength within a wavelength range ranging from an infrared band to a visible band;
an optical modulation section which modulates the laser light generated by the laser light generation section with a predetermined repetition frequency into pulsed light having a predetermined width;
an optical amplification section including an optical fiber amplifier which amplifies the laser light which has passed through the optical modulation section; and
a wavelength conversion section which performs wavelength conversion of the laser light amplified by the optical amplification section into ultraviolet light by using a nonlinear optical crystal, wherein
the width of the pulsed light modulated by the optical modulation section is set wider than a pulsewidth set for obtaining a predetermined wavelength width with finally generated ultraviolet light.

27. An exposure apparatus as recited in claim 8, wherein the width of the pulsed light modulated by the optical modulation section is 2 to 5 ns.

28. An apparatus according to claim 26, wherein
the laser light generation section pulse-generates the laser light by at least one of the single wavelength oscillatory laser and the optical modulation section.

29. An apparatus according to claim 26, wherein
the optical amplifier includes an erbium-doped optical fiber amplifier and uses laser light having a wavelength of about 980±10 nm as an excitation light for the amplifier.

30. An exposure apparatus which illuminates a pattern of a first object with ultraviolet light from a laser device and exposes a second object with the ultraviolet light which has passed through the pattern of the first object, wherein
the laser device includes:
a laser light generation section which generates laser light having a single wavelength within a wavelength range ranging from an infrared band to a visible band;
an optical amplification section including an optical fiber amplifier which amplifies the laser light generated by the laser light generation section, a transmitting optical fiber which propagates the laser amplified by the optical fiber amplifier, and a narrow band filter disposed between the optical fiber amplifier and the transmitting optical fiber; and
a wavelength conversion section which performs wavelength conversion of the laser light amplified by the optical amplification section into ultraviolet light by using a nonlinear optical crystal.

31. An exposure apparatus as recited in claim 30, wherein the narrow band filter is concurrently used as a wavelength division multiplexing device for multiplexing which feeds excitation light to the optical fiber amplifier.

32. An apparatus according to claim 30, wherein
the laser light generation section pulse-generates the laser light and includes an optical modulation section which sets a pulse-width of the laser light to be wider than a pulse-width set for obtaining a predetermined wavelength width with the ultraviolet light.

33. An apparatus according to claim 30, wherein
the optical amplifier includes an erbium-doped optical fiber amplifier and uses laser light having a wavelength of about 980±10 nm as an excitation light for the amplifier.

34. An exposure apparatus which illuminates a pattern of a first object with ultraviolet light from a laser device and exposes a second object with the ultraviolet light which has passed through the first object, wherein
the laser device includes:
a laser generation section which generates laser light having a wavelength within a wavelength range ranging from an infrared band to a visible band, an optical splitter which splits the laser light into a plurality of laser light beams, a plurality of optical fiber amplifiers which respectively and independently amplify the plurality of split laser light beams, a wavelength conversion section which performs wavelength conversion of the amplified laser light beams, and
the laser device includes a regulator which regulates an amplification gain at at least one of the plurality of the optical fiber amplifiers so that outputs of the plurality of split laser light beams are substantially uniformalized.

35. An exposure apparatus as recited in claim 34, wherein the regulator controls an excitation-light generating light source which generates excitation light used in the at least one optical fiber amplifier.

36. A method of manufacturing an exposure apparatus which illuminates a pattern of a first object with ultraviolet light from a laser device and that expose a second object with the ultraviolet light which has passed through the pattern of the first object, comprising configuring the laser device by disposing, with a predetermined relationship,
a laser light generation section which generates single wavelength laser light in a wavelength range of from an infrared region to a visible region, an optical amplification section including plural stages of optical fiber amplifiers which serially amplify the laser light generated by the laser light generation section, and a narrow band filter and an isolator disposed between the plural stages of the optical fiber amplifiers; and a wavelength conversion section which performs wavelength conversion of the laser light amplified by the optical amplification section into ultraviolet light by using a nonlinear optical crystal.

37. A method of manufacturing an exposure apparatus which illuminates a pattern of a first object with ultraviolet light from a laser device and which exposes a second object with the ultraviolet light which has passed through the pattern of the first object, comprising configuring the laser device by disposing, with a predetermined relationship, a laser light generation section which generates single wavelength laser light in a wavelength range of from an infrared region to a visible region;

an optical amplification section including plural stages of amplifying optical fibers which serially amplify the laser light generated by the laser light generation section, an excitation-light generating light source which generates excitation light for at least one stage of the amplifying optical fiber of the plural stages of the amplifying optical fibers, a narrow band filter or an isolator disposed between the plural stages of the amplifying optical fibers, and a bypass member which passes the excitation fight in parallel to the narrow band filter or the isolator; and a wavelength conversion section which performs wavelength conversion of the laser light amplified by the optical amplification section into ultraviolet light by using a nonlinear optical crystal.

38. An exposure apparatus which illuminates a first object having a pattern with ultraviolet light and exposes a second object with the ultraviolet light from the first object, comprising:

an illumination optical system disposed on an optical path through which the ultraviolet light passes; and a laser device optically connected to the illumination optical system, wherein the laser device includes:

a laser light generation section which includes a single wavelength oscillatory laser and generates single wavelength pulsed light in a wavelength range of about 1.51 $\mu$m to about 1.59 $\mu$m;

an optical amplification section including an optical fiber amplifier for amplifying the pulsed light and being optically connected to the laser light generation section;

a wavelength conversion section including a plurality of nonlinear optical crystals for performing wavelength conversion of the amplified pulsed light into a wavelength associated with ultraviolet light and being optically connected to the optical amplification section; and a suppressing section which suppresses expansion of a wavelength width of light originated in a nonlinear effect of an optical element of the laser device between the single wavelength oscillatory laser and the wavelength conversion section.

39. An apparatus according to claim 38, wherein the optical element includes at least the optical fiber amplifier.

40. An apparatus according to claim 39, further comprising a temperature control device which is connected to the wavelength conversion section and which controls a temperature of at least one of the plurality of nonlinear optical crystals.

41. An apparatus according to claim 40, wherein the plurality of nonlinear optical crystals include at least one nonlinear optical crystal used in NCPM (Non-Critical Phase Matching).

42. An apparatus according to claim 41, wherein the laser light generation section generates the pulsed light by at least one of the single wavelength oscillatory laser and an optical modulator.

43. An apparatus according to claim 42, wherein the laser light generation section pulse-generates light having a first pulse-width from the single wavelength oscillation laser and includes an optical modulator which generates the pulsed light having a second pulse-width narrower than the first pulse-width with the pulse-generated light.

44. An apparatus according to claim 38, wherein the laser light generation section generates the pulsed light by at least one of the single wavelength oscillatory laser and an optical modulator, and the apparatus further comprises an adjusting device connected to the laser light generation section for adjusting oscillation characteristics of the ultraviolet light generated from the wavelength conversion section.

45. An apparatus according to claim 44, wherein the oscillation characteristics include at least one of intensity, a central wavelength and an oscillation interval of the ultraviolet light.

46. An apparatus according to claim 44, wherein the adjusting device uses a detecting result of light having a wavelength different from the ultraviolet light.

47. A method of manufacturing an exposure apparatus which illuminates a first object having a pattern with ultraviolet light and exposes a second object with the ultraviolet light from the first object, comprising:

providing an illumination optical system to be disposed on an optical path through which the ultraviolet light passes; and optically connecting a laser device to the illumination optical system, the laser device including:

a laser light generation section which includes a single wavelength oscillatory laser and generates single wavelength pulsed light in a wavelength range of about 1.51 $\mu$m to about 1.59 $\mu$m;

an optical amplification section including an optical fiber amplifier for amplifying the pulsed light;

a wavelength conversion section including a plurality of nonlinear optical crystals for performing wavelength conversion of the amplified pulsed light into a wavelength associated with ultraviolet light; and a suppressing section which suppresses expansion of a wavelength width of light originated via a nonlinear effect of the optical fiber amplifier between the single wavelength oscillatory laser and the wavelength conversion section.

* * * * *